(12) United States Patent
Abe et al.

(10) Patent No.: US 7,217,489 B2
(45) Date of Patent: May 15, 2007

(54) PLANOGRAPHIC PRINTING PLATE

(75) Inventors: Yukio Abe, Shizuoka-ken (JP); Kazuto Shimada, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 340 days.

(21) Appl. No.: 10/389,898

(22) Filed: Mar. 18, 2003

(65) Prior Publication Data

US 2003/0198890 A1 Oct. 23, 2003

(30) Foreign Application Priority Data

Mar. 18, 2002 (JP) .............................. 2002-074047

(51) Int. Cl.
*G03F 7/021* (2006.01)
*G03F 7/023* (2006.01)
*G03F 7/032* (2006.01)

(52) U.S. Cl. ...................... 430/157; 430/162; 430/165; 430/270.1; 430/281.1; 430/288.1

(58) Field of Classification Search ................ 430/302, 430/157, 162, 270.1, 281.1, 288.1, 189
See application file for complete search history.

(56) References Cited

U.S. PATENT DOCUMENTS

| 4,708,925 | A | | 11/1987 | Newman |
| 5,340,699 | A | | 8/1994 | Haley et al. |
| 5,814,431 | A | * | 9/1998 | Nagasaka et al. ......... 430/281.1 |
| 6,790,590 | B2 | * | 9/2004 | Collins et al. ........... 430/270.1 |
| 6,794,116 | B2 | * | 9/2004 | Oshima ................... 430/281.1 |

FOREIGN PATENT DOCUMENTS

JP  7-103171  11/1995

* cited by examiner

*Primary Examiner*—John S. Chu
(74) *Attorney, Agent, or Firm*—Sughrue Mion, PLLC

(57) ABSTRACT

A negative-type planographic printing plate having, disposed on a support, a recording layer comprising an image recording material which contains an infrared ray absorbing agent and can be recorded by irradiation with an infrared ray, in which, as for the infrared ray absorbing agent comprising a cyanine dye, at least one of substituents on nitrogen atoms at both ends was selected from the group consisting of the following substituents: $-C(=X)R^1$; $-C(=X)NR^2R^3$; $-CH=CR^4R^5$; $-C\equiv CR^6$; $-CHR^7R^8$; $-CR^9R^{10}R^{11}$; and $-Ar$, wherein X represents O, S or Se; $R^1$ to $R^6$ each independently represent H or a hydrocarbon group having 20 or fewer carbon atoms which may have a substituent; $R^7$ to $R^{11}$ each independently represent a hydrocarbon group having 20 or fewer carbon atoms which may have a substituent; and Ar represents an aromatic group which may have a substituent.

17 Claims, No Drawings

PLANOGRAPHIC PRINTING PLATE

BACKGROUND OF THE INVENTION

1. Field of the Invention

The present invention relates to negative-type planographic printing plate. More particularly, the invention relates to a negative-type planographic printing plate having, disposed on a support, at least a recording layer comprising a heat-mode compatible, negative-type image recording material usable for a planographic printing plate precursors which is capable of directly forming a printing plate, that is, capable of direct printing plate production by performing scanning with infrared ray lasers in accordance with digital signals outputted from a computer or the like.

2. Description of the Related Art

Heretofore, as for systems for performing such direct printing plate production in accordance with digital data outputted from a computer, systems for direct printing plate production by:

(1) electrophotography;
(2) photopolymerization by exposure with a laser emitting a blue or green light;
(3) a laminate comprising a silver halide superposed on a photosensitive resin;
(4) a silver salt diffusion transfer process; and the like have been proposed.

However, in the system (1) which utilizes the electrophotography, an image forming process comprising charging process, exposure, development and the like is troublesome and complicated and large scaled apparatus is required. In the system (2) which utilizes photopolymerization, a plate sensible to blue or green lights are used. Therefore it becomes difficult to handle the plates in a lighted room. In the systems (3) and (4), the silver halide is used whereby a process comprising development becomes complicated and, further, there is a drawback in that silver is contained in waste water of treatments.

With remarkable developments of lasers in recent years, in particular solid state lasers and semiconductor lasers which emit an infrared ray particularly in a wavelength range from 760 nm to 1200 nm, and which have a high output in power and are compact in size have become readily available. Such lasers are extremely effective as a light source for recording in performing the direct printing plate production in accordance with the digital data outputted from a computer or the like. However, since a multiplicity of practically useful photosensitive recording materials have sensitivity in visible light range which is in a wavelength of 760 nm or less, so, image recording can not be performed by such infrared ray lasers. Accordingly, there has been a demand for a material on which an image can be recorded by the infrared ray lasers.

An image recording material, comprising an onium salt, a phenolic resin, and a spectral sensitizer, on which an image can be recorded by the infrared ray lasers, is disclosed in U.S. Pat. No. 4,708,925. This image recording material is a positive-type image recording material that utilizes a inhibition of dissolution in a developer by the onium salt and the phenolic resin So, this positive-type image recording material is different from the negative-type one according to the present invention.

On the other hand, as for negative-type image recording materials, a recording material comprising an infrared ray absorbing agent, an acid generating agent, a resol resin and a novolak resin is disclosed in U.S. Pat. No. 5,340,699. However, such negative-type image recording materials require heat treatment for image forming after a laser exposure is performed whereupon there has been a demand for the negative-type image recording material which does not require the heat treatment after the exposure is performed.

For example, the recording material which can be addtion-polymerized and which does not require the heat treatment after exposure for image formation is performed is described in Japanese Patent Application Publication (JP-B) No. 7-103171. This material comprises an addition-polymerizable compound that contains a cyanine dye having a specific structure, a iodonium salt and an ethylenically unsaturated double bond. However, in this image recording material, particularly storability of dyes is decreased and an unexposed area thereof becomes hard to be dissolved in a developer depending on environmental conditions of storage thereof. Hence, there has been a problem in that discrimination between the unexposed area and an exposed area is insufficient, a non-image area is liable to be imparted with a stain and the like.

SUMMARY OF THE INVENTION

An object of the present invention which has been achieved taking the above-described defects of prior art into consideration is to provide a negative-type planographic printing plate having, disposed on a support, at least a recording layer comprising a negative-type image recording material which can be directly recorded in accordance with digital data outputted from a computer or the like by performing recording by a solid laser or a semiconductor laser that emits an infrared ray and which has excellent storage stability, particularly raw stock storability when it is used as a recording layer for a planographic printing plate.

As a result of intensive studies, the present inventors have focused on components of a negative-type image recording material of the negative-type planographic printing plate, and have found that the above-described object can be attained by using a cyanine dye having a specific partial structure as an infrared ray absorbing agent, thereby accomplishing the invention.

Namely, the object of the invention can be attained by the negative-type planographic printing plate described below.

A first aspect of the negative-type planographic printing plate according to the invention is a negative-type planographic printing plate having, disposed on a support, at least a recording layer comprising a negative-type image recording material on which an image can be recorded by irradiation with an infrared ray, the negative-type image recording material including an infrared ray absorbing agent comprising a cyanine dye in which at least one of substituents on nitrogen atoms at both terminal ends thereof is selected from the group consisting of the following substituents:

—C(=X)R$^1$;
—C(=X)NR$^2$R$^3$;
—CH=CR$^4$R$^5$;
—C≡CR$^6$;
—CHR$^7$R$^8$;
—CR$^9$R$^{10}$R$^{11}$; and
—Ar, wherein X represents O, S or Se;

R$^1$ to R$^6$ each independently represent H or a hydrocarbon group having 20 or fewer carbon atoms which may have a substituent;

R$^7$ to R$^{11}$ each independently represent a hydrocarbon group having 20 or fewer carbon atoms which may have a substituent; and Ar represents an aromatic group which may have a substituent.

A second aspect of the negative-type planographic printing plate according to the invention is the negative-type planographic printing plate according to the first aspect, wherein the negative-type image recording material further comprises a radical generating agent and a radical polymerizable compound.

A third aspect of the negative-type planographic printing plate according to the invention is the negative-type planographic printing plate according to the first aspect, in which the infrared ray absorbing agent comprises a cyanine dye represented by the following general formula (1):

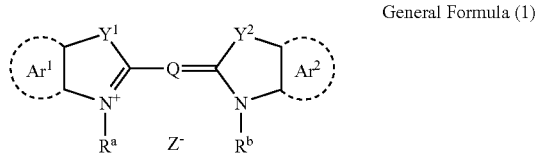

General Formula (1)

wherein $R^a$ and $R^b$ may be the same as or different from each other and each independently represent a hydrogen atom or a monovalent substituent, and wherein at least one of $R^a$ and $R^b$ represents a substituent selected from the group consisting of:

—C(=X)$R^1$;
—C(=X)$NR^2R^3$;
—CH=$CR^4R^5$;
—C≡$CR^6$;
—$CHR^7R^8$;
—$CR^9R^{10}R^{11}$; and
—Ar, wherein $R^1$ to $R^6$ each independently represent H or a hydrocarbon group having 20 or fewer carbon atoms which may have a substituent;

$R^7$ to $R^{11}$ each independently represent a hydrocarbon group having 20 or fewer carbon atoms which may have a substituent;

X represents an atom such as O, S or Se other than a divalent carbon atom;

$Ar^1$ and $Ar^2$ each independently represent an aromatic hydrocarbon group or a heterocyclic group both of which may have a substituent; and $Y^1$ and $Y^2$ may be the same as or different from each other and each independently represent one selected from the group consisting of a sulfur atom, an oxygen atom, a selenium atom, a dialkylmethylene group having 12 or less carbon atoms, —CH=CH— and —$NR^{Y1}$—;

Q represents a pentamethine group or a heptamethine group; and

Z represents a counter ion which is present when neutralization of an electric charge is required.

$R^{Y1}$ represents H or a hydrocarbon group having 20 or fewer carbon atoms which may have a substituent.

A fourth aspect of the negative-type planographic printing plate according to the invention is the negative-type planographic printing plate according to the first aspect, in which the infrared ray absorbing agent is contained in an amount ranging from 0.01% by mass to 50% by mass based on a total solid content of the negative-type image recording material.

A fifth aspect of the negative-type planographic printing plate according to the invention is the negative-type planographic printing plate according to the first aspect, in which the infrared ray absorbing agent comprises at least one of an infrared ray absorbing dyes or an infrared ray absorbing pigments, both of which have an absorption maximum in a wavelength ranging from 760 nm to 1200 nm.

A sixth aspect of the negative-type planographic printing plate according to the invention is the negative-type planographic printing plate according to the second aspect, in which the radical generating agent comprises at least one member selected from the group consisting of an onium salt, a triazine compound, a peroxide, an azo-type polymerization initiator, an azide compound, a quinone diazide compound, a metallocene compound and an organic borate compound.

A seventh aspect of the negative-type planographic printing plate according to the invention is the negative-type planographic printing plate according to the second aspect, in which the radical generating agent comprises an onium salt selected from the group consisting of a diazonium salt, an iodonium salt, a sulfonium salt, an ammonium salt and a pyridinium salt.

An eighth aspect of the negative-type planographic printing plate according to the invention is the negative-type planographic printing plate according to the second aspect, in which the radical generating agent comprises an onium salt selected from the group consisting of onium salts represented by the following general formulae (I) to (III):

General Formula (I)

General Formula (II)

General Formula (III)

wherein, particularly in the general formula (I), $Ar^{11}$ and $Ar^{12}$ each independently represent an aryl group having 20 or fewer carbon atoms both of which may have a substituent; and $(Z^{11})^-$ represents a counter ion selected from the group consisting of a halogen ion, a perchloric acid ion, a tetrafluoroborate ion, a hexafluorophosphate ion, a carboxylate ion and a sulfonic acid ion, wherein, particularly in the general formula (II), $Ar^{21}$ represents an aryl group having 20 or fewer carbon atoms which may have a substituent; and $(Z^{12})^-$ represents a counter ion equivalent to $(Z^{11})^-$, and wherein, particularly in the general formula (III), $R^{31}$ to $R^{33}$ may be the same as or different from one another and each independently represent a hydrocarbon group having 20 or fewer carbon atoms which may have a substituent; and $(Z^{13})^-$ represents a counter ion equivalent to $(Z^{11})^-$.

A ninth aspect of the negative-type planographic printing plate according to the invention is the negative-type planographic printing plate according to the second aspect, in which the radical generating agent is contained in an amount ranging from 0.1% by mass to 50% by mass based on a total solid content of the negative-type image recording material.

An tenth aspect of the negative-type planographic printing plate according to the invention is the negative-type planographic printing plate according to the second aspect, in which the radical polymerizable compound is a radical polymerizable compound having at least one ethylenically unsaturated double bond.

A eleventh aspect of the negative-type planographic printing plate according to the invention is the negative-type planographic printing plate according to the second aspect, in which the radical polymerizable compound has at least one type selected from the group consisting of an unsaturated carboxylic acid, unsaturated carboxylic acid esters and unsaturated carboxylic acid amides.

A twelfth aspect of the negative-type planographic printing plate according to the invention is the negative-type planographic printing plate according to the first aspect, further comprising a binder polymer.

A thirteenth aspect of the negative-type planographic printing plate according to the invention is the negative-type planographic printing plate according to the twelfth aspect, in which the binder polymer is a linear organic polymer that is soluble or swellable in at least one of water and weak-alkaline water.

A fourteenth aspect of the negative-type planographic printing plate according to the invention is the negative-type planographic printing plate according to the twelfth aspect, in which the binder polymer is contained in an amount ranging from 20% by mass to 95% by mass based on a total solid content of the negative-type image recording material.

A fifteenth aspect of the negative-type planographic printing plate according to the invention is the negative-type planographic printing plate according to the first aspect, wherein the negative-type image recording material further comprises a coloring agent.

A sixteenth aspect of the negative-type planographic printing plate according to the invention is the negative-type planographic printing plate according to the first aspect, wherein the negative-type image recording material further comprises a thermopolymerization inhibitor.

An seventeenth aspect of the negative-type planographic printing plate according to the invention is the negative-type planographic printing plate according to the first aspect, wherein the negative-type image recording material further comprises at least one type of a nonionic surfactant and an amphoteric surfactant.

A eighteenth aspect of the negative-type planographic printing plate according to the invention is the negative-type planographic printing plate according to the first aspect, wherein the negative-type image recording material further comprises a plasticizer.

It is considered that, since neither a structure of —$CH_2$—R nor an α hydrogen derived from the structure is present in substituents on nitrogen atoms on both terminal ends in the specific cyanine dye according to the invention, the infrared ray absorbing agent comprising the specific cyanine dye is hard to oxidize and, accordingly, even when the image recording material is stored over time, particularly under severe conditions such as a high temperature, decomposition of the infrared ray absorbing agent therein is inhibited to enhance raw stock storability of the image recording material.

Therefore, it is considered that, when the negative-type planographic printing plate according to the invention is used, an unexposed area (non-image area) of the recording layer is dissolved by a developer and removed without remaining on a support, thereby becoming capable of obtaining a printed article having no stain in the non-image area. On the other hand, it is considered that, since the infrared ray absorbing agent is difficult to be decomposed in an image area thereof, energy absorbing efficiency is not decreased and, accordingly, recording can be performed with high sensitivity and also a curing reaction is sufficiently progressed, therefore a planographic printing plate excellent in printing durability can be obtained.

Further, the term "heat mode compatible" as used herein means capability of being recorded by heat mode exposure. Definition of the heat mode exposure according to the invention is described in detail below. As is described in Hans-Joachim Timple, IS&Ts NIP 15:1999, International Conference on Digital Printing Technologies, p. 209, it is known that there are two modes, when roughly classified, in a process from photo-excitation to chemical or physical change of a light absorbing substance (for example, dye) which functions to form an image. One of the modes is so-called photon mode in which the photo-excited light absorbing substance is deactivated by performing some photochemical interaction (for example, energy transition and electron transition) with any other reactant in the photosensitive material and, as a result, the thus-deactivated reactive substance causes a chemical or physical reaction necessary for forming an image, while the other mode is a so-called heat mode in which the thus-photo-excited light absorbing substance is deactivated by generating heat and, then, the reactant causes the chemical or physical reaction necessary for forming the image by utilizing the thus-generated heat. As other modes than those described above, there are peculiar modes, such as, ablation in which a substance is explosively spattered by a locally focused light energy, a multiple photon absorption in which one molecule absorbs a multiple of photons at a time and the like: however, explanations of these peculiar modes are herein omitted.

Respective exposure processes utilizing the above-described modes are called "photon mode exposure" and "heat mode exposure" in order. Technical difference between the photon mode exposure and the heat mode exposure lies on a point whether amounts of energy of a plurality of photons can be added up and used in exposure to fulfill the energy requirement for a targeted reaction. Take, for example, a case in which some reaction is caused by using n photons. Since a photochemical interaction is utilized in the photon mode exposure, energy of quantum and energy of one photon can not be added up and used on the basis of requirements of the law of conservation of momentum. Namely, in order to allow some reaction to occur, a relation of "amounts of energy of one photon≧amounts of energy of reaction" must be satisfied. On the other hand, in the heat mode exposure, since heat is generated after photoexcitation, that is, light energy is converted into heat, and the resultant heat is utilized. Therefore, it becomes possible to add up amounts of energy. Accordingly, it is sufficient only to satisfy the relation of "amounts of energy of n photon≧amounts of energy of reaction". However, such addition of amounts of energy is restricted by thermal diffusion. In other words, if a next photoexcitation-deactivation process occurs and heat is generated by the time heat is dissipated by heat diffusion from the exposed area (reaction point) of subject, heat is surely accumulated, thereby increasing a temperature in the exposed area. However, in a case of delayed generation of the next heat, heat is dissipated and, accordingly, can not be accumulated. Namely, in the heat mode exposure, even when same amount of total exposure energy is applied, a result to be obtained varies depending on cases in which light having amounts of high energy is irradiated for a short period of time and light having amounts of low energy is irradiated for a long period of time; the former case, that is, short-time irradiation, is advantageous for heat accumulation.

It goes without saying that, also in the photon mode exposure, a similar phenomenon to that described above may sometimes occur by an influence of diffusion of subsequent reaction species, but such phenomenon does not occur basically.

Namely, from the standpoint of characteristics of the photosensitive material, in the photon mode, an inherent sensitivity (amounts of energy required for a reaction necessary for image forming) of the photosensitive material is constant regardless of exposure power density (w/cm$^2$) (=energy density per unit time), whereas, in the heat mode, the inherent sensitivity of the photosensitive material is increased with the exposure power density. Therefore, suppose a case in which an exposure time period is a fixed time period capable of maintaining productivity practically required for a use as the image recording material, and both modes are compared with each other. In the photon mode exposure, high sensitization in a level of about 0.1 mJ/cm$^2$ can ordinarily be attained. But, since even a small exposure amount can cause a reaction, a problem of fogging at a low intensity exposure is likely to occur in an unexposed area. On the other hand, in the heat mode exposure, a reaction does not occur unless the exposure amount is more than a given amount. Since sensitivity of about 50 mJ/cm$^2$ is ordinarily required from a relationship with heat stability of the photosensitive material, the problem of fogging at the low intensity exposure can be avoided.

Actually, in the heat mode exposure, 5000 w/cm$^2$ or more of the exposure power density is required on a surface of a plate containing the photosensitive material and, preferably, 10000 w/cm$^2$ or more thereof is required. Though not described in detail herein, when a laser having a high power density of $5.0 \times 10^5$ w/cm$^2$ or more is used, ablation occurs. Such occasion is unfavorable due to a problem of staining a light source or the like.

DESCRIPTION OF THE PREFERRED EMBODIMENTS

Hereinafter, the present invention will be described in detail.

(A) Infrared Ray Absorbing Agent

According to the present invention, as an infrared ray absorbing agent, used is a cyanine dye in which at least one of substituents on nitrogen atoms at both terminal ends is a substituent selected from the group consisting of the following substituents:

—C(=X)R$^1$;
—C(=X)NR$^2$R$^3$;
—CH=CR$^4$R$^5$;
—C≡CR$^6$;
—CHR$^7$R$^8$;
—CR$^9$R$^{10}$R$^{11}$; and
—Ar, wherein X represents O, S or Se;
R$^1$ to R$^6$ each independently represent H or a hydrocarbon group having 20 or fewer carbon atoms which may have a substituent;
R$^7$ to R$^{11}$ each independently represent a hydrocarbon group having 20 or fewer carbon atoms which may have a substituent; and
Ar represents an aromatic group which may have a substituent.

As such cyanine dyes, specifically, for example, dyes represented by the following general formula (1) can be cited:

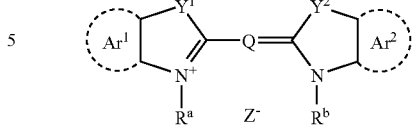

General Formula (1)

wherein R$^a$ and R$^b$ may be the same as or different from each other and each independently represent a hydrogen atom or a monovalent substituent, and wherein at least one of R$^a$ and R$^b$ represents a substituent selected from the group consisting of:

—C(=X)R$^1$;
—C(=X)NR$^2$R$^3$;
—CH=CR$^4$R$^5$;
—C≡CR$^6$;
—CHR$^7$R$^8$;
—CR$^9$R$^{10}$R$^{11}$; and
—Ar, wherein R$^1$ to R$^6$ each independently represent H or a hydrocarbon group having 20 or fewer carbon atoms which may have a substituent;
R$^7$ to R$^{11}$ each independently represent a hydrocarbon group having 20 or fewer carbon atoms which may have a substituent;
X represents an atom such as O, S or Se other than a divalent carbon atom; and Ar represents an aromatic group which may have a substituent. Specific examples of R$^a$ and R$^b$ represented by the general formula (1) include —CH=CH$_2$, —C≡CH, —C(=O)CH$_3$, —C$_6$H$_5$, —C(CH$_3$)$_3$ and —CH(CH$_3$)$_2$. From the standpoint of suitability for synthesis, it is preferable that a specific substituentselected from the group consisting of these substituents is contained in each of R$^a$ and R$^b$ in the general formula (1).

In the general formula (1), Ar$^1$ and Ar$^2$ each independently represent an aromatic hydrocarbon group or a heterocyclic group which may have a substituent. These groups having a ring structure may have a monocyclic structure or a condensed polycyclic structure. Examples of preferable aromatic hydrocarbon groups include a benzene ring, a naphthalene ring. And examples of preferable heterocyclic groups include a pyridine ring and a pyrazine ring. The benzene ring or the naphthalene ring is particularly preferable.

When Ar$^1$ and Ar$^2$ have a substituent, examples of same substituents capable of being introduced thereinto include a halogen atom, an alkyl group, an aryl group, an alkoxy group, an aryloxy group, an alkylthio group, an arylthio group, a dialkylamino group and a diarylamino group.

Y$^1$ and Y$^2$ may be the same as or different from each other and each independently represent one selected from the group consisting of a sulfur atom, an oxygen atom, a selenium atom, a dialkylmethylene group having 12 or less carbon atoms, —CH=CH— and —NR$^{Y1}$—, in which the dialkymethylene group such as the dimethylmethylene group is preferable. R$^{Y1}$ represents H or a hydrocarbon group having 20 or fewer carbon atoms which may have a substituent.

Q represents a pentamethine group or a heptamethine group. Heptamethine is preferable due to its wavelength suitability to the infrared ray and stability. Methine groups represented by Q may be substituted by a group selected from an alkoxy group, an aryloxy group, an alkylthio group, an arylthio group, a dialkylamino group, a diarylamino group, a halogen atom, an alkyl group, an aryl group and an oxy group, and a group selected from the substituents represented by the following general formula (2); examples of preferable substituents include diarylamino groups such as diphenylamino group and arylthio groups such as phenylthio group:

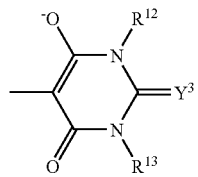

General Formula (2)

wherein $R^{12}$ and $R^{13}$ each independently represent a member equivalent to $R^1$ to $R^6$; and $Y^3$ represents an atom selected from the group consisting of a sulfur atom, an oxygen atom and a selenium atom.

It is preferable from the standpoint of stability that Q further contains a member selected from the group consisting of a cyclohexene ring, a cyclopentene ring or a cyclobutene ring, each of which have continuous three methine chains, in which the cyclopentene ring or the cyclohexene ring is particularly preferable.

$Z^-$ represents a counter ion which is present when neutralization of an electric charge is required. When $Z^-$ is an anion, examples of such anion include a halogen ion, a perchloric acid ion, a tetrafluoroborate ion, a hexafluorophosphate ion and a sulfonic acid ion. Among them the perchloric acid ion and the sulfonic acid ion are particularly preferable thereamong. Further, when $Z^-$ is a cation, examples of such cation include organic ions such as an ammonium ion and a sulfonium ion, alkali metal ions and an alkali earth metal ions such as a sodium ion, a potassium ion, a calcium ion.

According to the invention, examples of the infrared ray absorbing agents which can favorably be used are described in Tables 1 to 7 below while explicitly showing skeletons of chromophores and substituents thereof. However, these examples are given to illustrate the invention and should not be interpreted as limiting it in any way.

TABLE 1

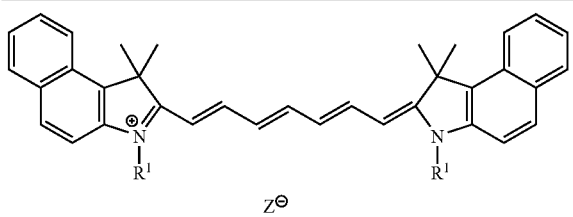

| | $R^1$ | Z |
|---|---|---|
| IR-1 | CH=CH$_2$ | CF$_3$SO$_3$ |
| IR-2 | C≡CH | I |
| IR-3 | C(=O)CH$_3$ | ClO$_4$ |
| IR-4 | C$_6$H$_5$ | CH$_3$C$_6$H$_4$SO$_3$ |
| IR-5 | C(CH$_3$)$_3$ | CF$_3$SO$_3$ |
| IR-6 | CH(CH$_3$)$_2$ | CH$_3$C$_6$H$_4$SO$_3$ |

TABLE 2

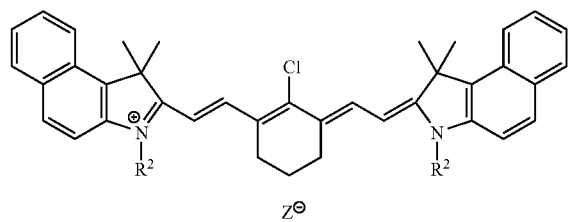

| | $R^2$ | Z |
|---|---|---|
| IR-7 | CH=CH$_2$ | CF$_3$SO$_3$ |
| IR-8 | C≡CH | I |
| IR-9 | C(=O)CH$_3$ | ClO$_4$ |
| IR-10 | C$_6$H$_5$ | CH$_3$C$_6$H$_4$SO$_3$ |
| IR-11 | C(CH$_3$)$_3$ | CF$_3$SO$_3$ |
| IR-12 | CH(CH$_3$)$_2$ | CH$_3$C$_6$H$_4$SO$_3$ |

TABLE 3

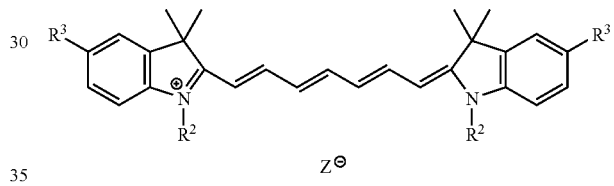

| | $R^2$ | $R^3$ | Z |
|---|---|---|---|
| IR-13 | CH=CH$_2$ | H | CF$_3$SO$_3$ |
| IR-14 | C≡CH | Cl | I |
| IR-15 | C(=O)CH$_3$ | H | ClO$_4$ |
| IR-16 | C$_6$H$_5$ | SO$_2$CH$_3$ | BF$_4$ |
| IR-17 | C(CH$_3$)$_3$ | Cl | CF$_3$SO$_3$ |
| IR-18 | CH(CH$_3$)$_2$ | SO$_2$CH$_3$ | CH$_3$C$_6$H$_4$SO$_3$ |

TABLE 4

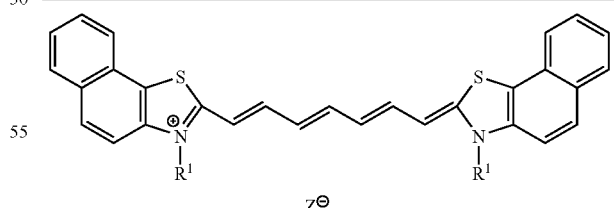

| | $R^1$ | Z |
|---|---|---|
| IR-19 | CH=CH$_2$ | BF$_4$ |
| IR-20 | C≡CH | I |
| IR-21 | C(=O)CH$_3$ | ClO$_4$ |
| IR-22 | C$_6$H$_5$ | CH$_3$C$_6$H$_4$SO$_3$ |
| IR-23 | C(CH$_3$)$_3$ | CF$_3$SO$_3$ |
| IR-24 | CH(CH$_3$)$_2$ | CH$_3$C$_6$H$_4$SO$_3$ |

TABLE 5

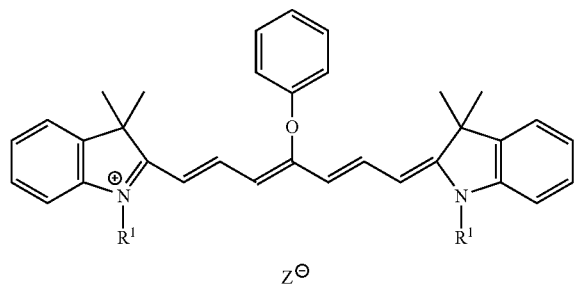

| | $R^1$ | Z |
|---|---|---|
| IR-25 | CH=CH$_2$ | CF$_3$SO$_3$ |
| IR-26 | C≡CH | I |
| IR-27 | C(=O)CH$_3$ | ClO$_4$ |
| IR-28 | C$_6$H$_5$ | BF$_4$ |
| IR-29 | C(CH$_3$)$_3$ | CF$_3$SO$_3$ |
| IR-30 | CH(CH$_3$)$_2$ | CH$_3$C$_6$H$_4$SO$_3$ |

TABLE 6

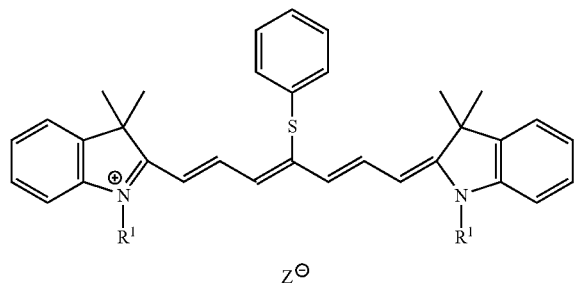

| | $R^1$ | Z |
|---|---|---|
| IR-31 | CH=CH$_2$ | BF$_4$ |
| IR-32 | C≡CH | I |
| IR-33 | C(=O)CH$_3$ | ClO$_4$ |
| IR-34 | C$_6$H$_5$ | CH$_3$C$_6$H$_4$SO$_3$ |
| IR-35 | C(CH$_3$)$_3$ | CF$_3$SO$_3$ |
| IR-36 | CH(CH$_3$)$_2$ | CH$_3$C$_6$H$_4$SO$_3$ |

TABLE 7

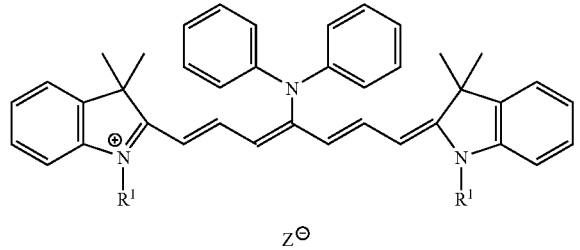

| | $R^1$ | Z |
|---|---|---|
| IR-37 | CH=CH$_2$ | CF$_3$SO$_3$ |
| IR-38 | C≡CH | I |
| IR-39 | C(=O)CH$_3$ | BF$_4$ |
| IR-40 | C$_6$H$_5$ | CH$_3$C$_6$H$_4$SO$_3$ |
| IR-41 | C(CH$_3$)$_3$ | CF$_3$SO$_3$ |
| IR-42 | CH(CH$_3$)$_2$ | CH$_3$C$_6$H$_4$SO$_3$ |

These infrared ray absorbing agents can be produced by known organic synthesis techniques. Specifically, they can be synthesized by synthesis methods described in Sov. Prog. Chem., Vol. 41, No. 11, pp. 42 to 46 (1975); Ukr. Khim. Zh., Vol. 41, No. 11, pp. 165 to 1170 (1970); Ukr. Khim. Zh., Vol. 55, No. 3, pp. 290 to 294 (1986); and U.S. Pat. No. 3,408,195, EP-A No. 670374 A1, U.S. Pat. No. 5,571,388 and the like.

The above-specified infrared ray absorbing agents relative to the invention are themselves excellent in storage stability such that, when compounded in a below-mentioned negative-type image forming material composition and stored for one day at 60° C., a decomposition rate thereof is preferably 60% or less and more preferably 40% or less.

The decomposition rate of the infrared ray absorbing agent in the composition can be measured by using a liquid chromatography and, according to the invention, values obtained by such measurement are adopted.

The infrared ray absorbing agents may be used either each individually or in combinations of any two types or more.

The infrared ray absorbing agents can be added in the image recording material, based on a total solid content of the image recording material, in a rate ranging from 0.01% by mass to 50% by mass, preferably ranging from 0.1% by mass to 20% by mass and particularly preferably ranging from 1% by mass to 10% by mass. In such addition range, the image recording material which is excellent in recording sensitivity and in which generation of the stain in the non-image area is restricted can be obtained.

Further, so far as effect of the invention is not impaired, a general-purpose infrared ray absorbing agent can simultaneously be used. On this occasion, an amount of the general-use infrared ray absorbing agent to be contained is preferably 40% by mass or less based on the total solid content of the infrared ray absorbing agents.

As for such infrared ray absorbing agents capable of being simultaneously used, so long as they absorb light energy irradiation ray for use in recording and release heat, any substance can be used without limitation to particular absorption wavelength bands. However, from the standpoint of adaptability to a high output laser which is readily available, an infrared ray absorbing dye or pigment which has an absorption maximum in a wavelength ranging from 760 nm to 1200 nm is preferable whereupon, for example, dyes, pigments and the like as described in Japanese Patent Application Laid-Open (JP-A) Nos. 7-285275 and 10-268512 can be cited.

When the recording material is produced by using any one of these infrared ray absorbing agents, an optical density at the absorption maximum in the infrared ray range is preferably in a range from 0.05 to 3.0. Since the optical density is determined by such addition amount of the infrared ray absorbing agent and thickness of the recording layer, a specific optical density can be obtained by controlling both of the above conditions. The optical density of the recording layer can be measured by a conventional method. As for the measuring methods, for example, a method in which a recording layer is formed on a transparent or white support, which recording layer has a coating thickness after dried appropriately determined in a range necessary for the planographic printing plate and, then, measured by a transmission-type optical densitometer, and another method in which the recording layer is formed on a reflective support made of aluminum or the like and, then, a reflection density is measured can be cited.

These infrared ray absorbing agents may each be added to a same layer along with any other component or added to a separately provided layer.

The negative-type image recording material according to the invention is not particularly limited, so long as it contains the specific infrared ray absorbing agent(A) described above; it is particularly preferable that the negative-type image recording material is used as a negative image recording layer of a polymerization-curing type which contains (B) a radical generating agent and (C) a radical polymerizable compound which are described in detail below.

(B) Radical Generating Agent

The term "radical generating agent" as used herein means a compound which generates a radical by energy of light, heat, or both of them to initiate and promote polymerization of a compound having a polymerizable unsaturated group. As for such radical generating agents relative to the invention, a compound having a known thermopolymerization initiator or having a bond of small bond/dissociation energy and the like can be appropriately selected and used. Examples of the radical generating agents include an onium salt, a triazine compound having a trihalomethyl group, a peroxide, an azo-type polymerization initiator, an azide compound, a quinone diazide compound, a metallocene compound and an organic borate compound; however, onium salts to be described below are highly sensitive and favorable.

Examples of the onium salts which are favorably used as the radical generating agents according to the invention include a diazonium salt, an iodonium salt, a sulfonium salt, an ammonium salt and a pyridinium salt. Amongthem, the iodonium salt, the diazonium salt, the sulfonium salt are favorably mentioned. According to the invention, these onium salts function not as an acid generating agent but as an initiator of ionic radical polymerization. The onium salts favorably used according to the invention are such onium salts as represented by the following general formulae (I) to (III):

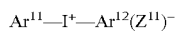   General Formula (I)

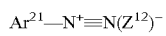   General Formula (II)

   General Formula (III)

In the general formula (I), $Ar^{11}$ and $Ar^{12}$ each independently represent an aryl group having 20 or fewer carbon atoms which may have a substituent. When the aryl group has a substituent, examples of preferable substituents include a halogen atom, a nitro group, an alkyl group having 12 or less carbon atoms, an alkoxy group having 12 or less carbon atoms and an aryloxy group having 12 or less carbon atoms. $(Z^{11})^-$ represents a counter ion selected from the group consisting of a halogen ion, a perchloric acid ion, a tetrafluoroborate ion, a hexafluorophosphate ion, a carboxylate ion and a sulfonic acid ion, in which the perchloric acid ion, the hexafluorophosphate ion and the carboxylate ion thereamong and further an aryl sulfonic acid ion are preferable.

In the general formula (II), $Ar^{21}$ represents an aryl group having 20 or fewer carbon atoms which may have a substituent. Examples of preferable substituents include a halogen atom, a nitro group, an alkyl group having 12 or less carbon atoms, an alkoxy group having 12 or less carbon atoms, an aryloxy group having 12 or less carbon atoms, an alkylamino group having 12 or less carbon atoms, dialkylamino group having 12 or less carbon atoms, an arylamino group having 12 or less carbon atoms and diarylamino group having 12 or less carbon atoms. $(Z^{12})^-$ represents a counter ion equivalent to $(Z^{11})^-$.

In the general formula (III), $R^{31}$ to $R^{33}$ may be the same as or different from one another and each independently represent a hydrocarbon having 20 or fewer carbon atoms which may have a substituent. Examples of preferable substituents include a halogen atom, a nitro group, an alkyl group having 12 or less carbon atoms, an alkoxy group having 12 or less carbon atoms or an aryloxy group having 12 or less carbon atoms. $(Z^{13})^-$ represents a counter ion equivalent to $(Z^{11})^-$.

Specific examples of, being favorably usable according to the invention, onium salts ([OI-1] to [OI-10]) represented by the general formulae (I), onium salts ([ON-1] to [ON-5]) represented by the general formulae (II) and onium salts ([OS-1] to [OS-7]) represented by the general formulae (III) are as follows:

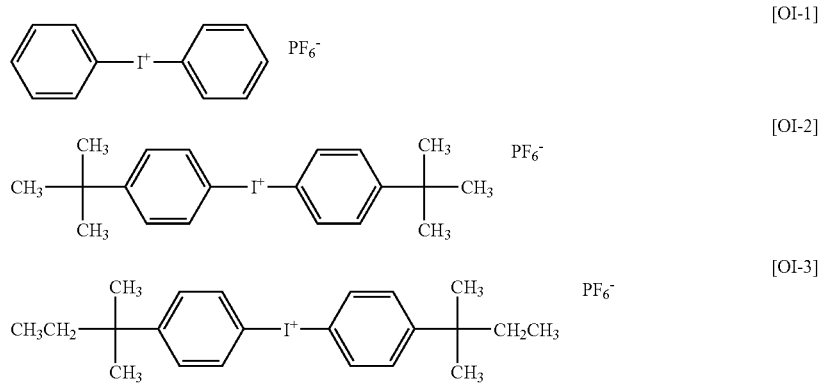

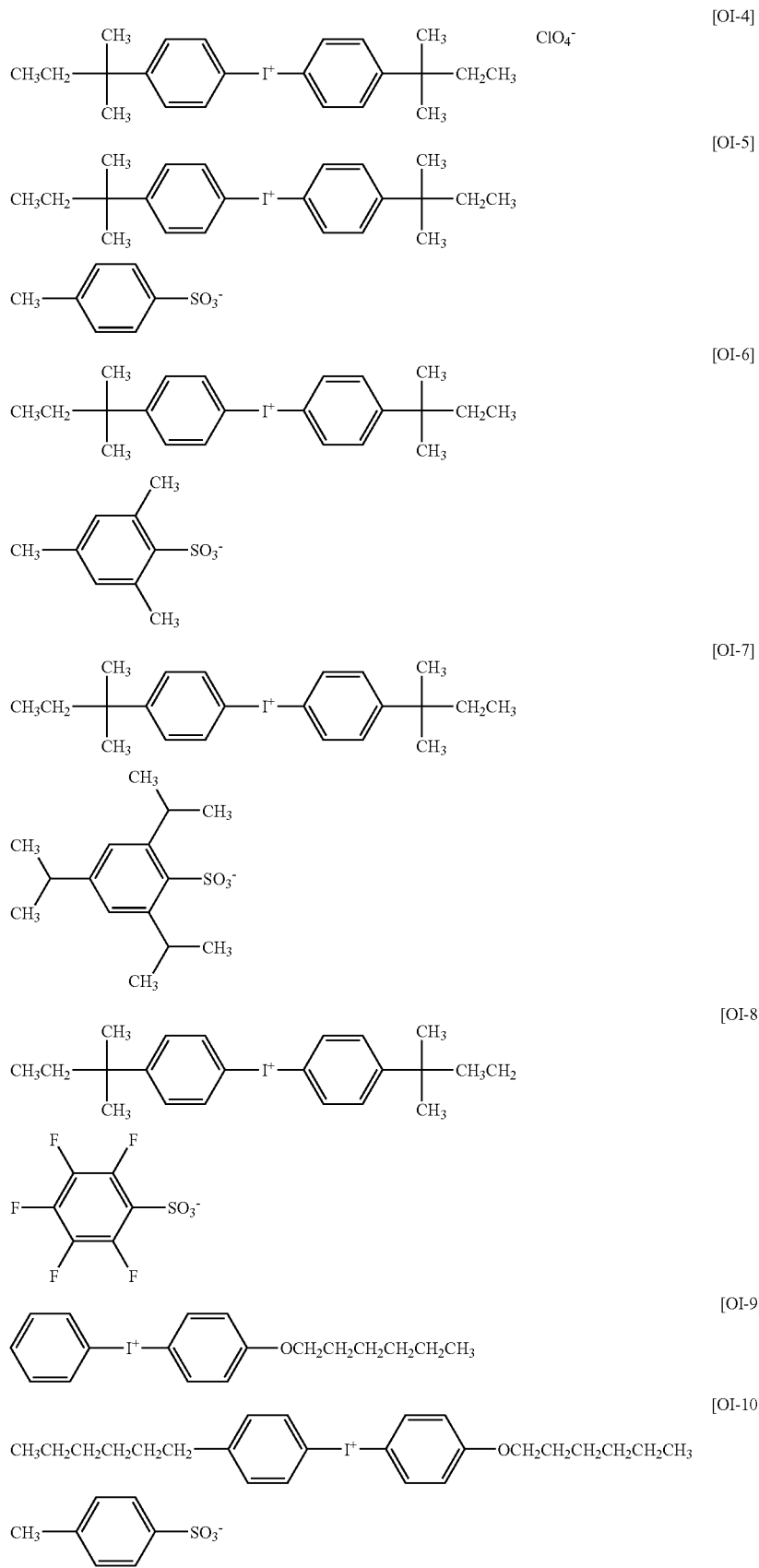

-continued
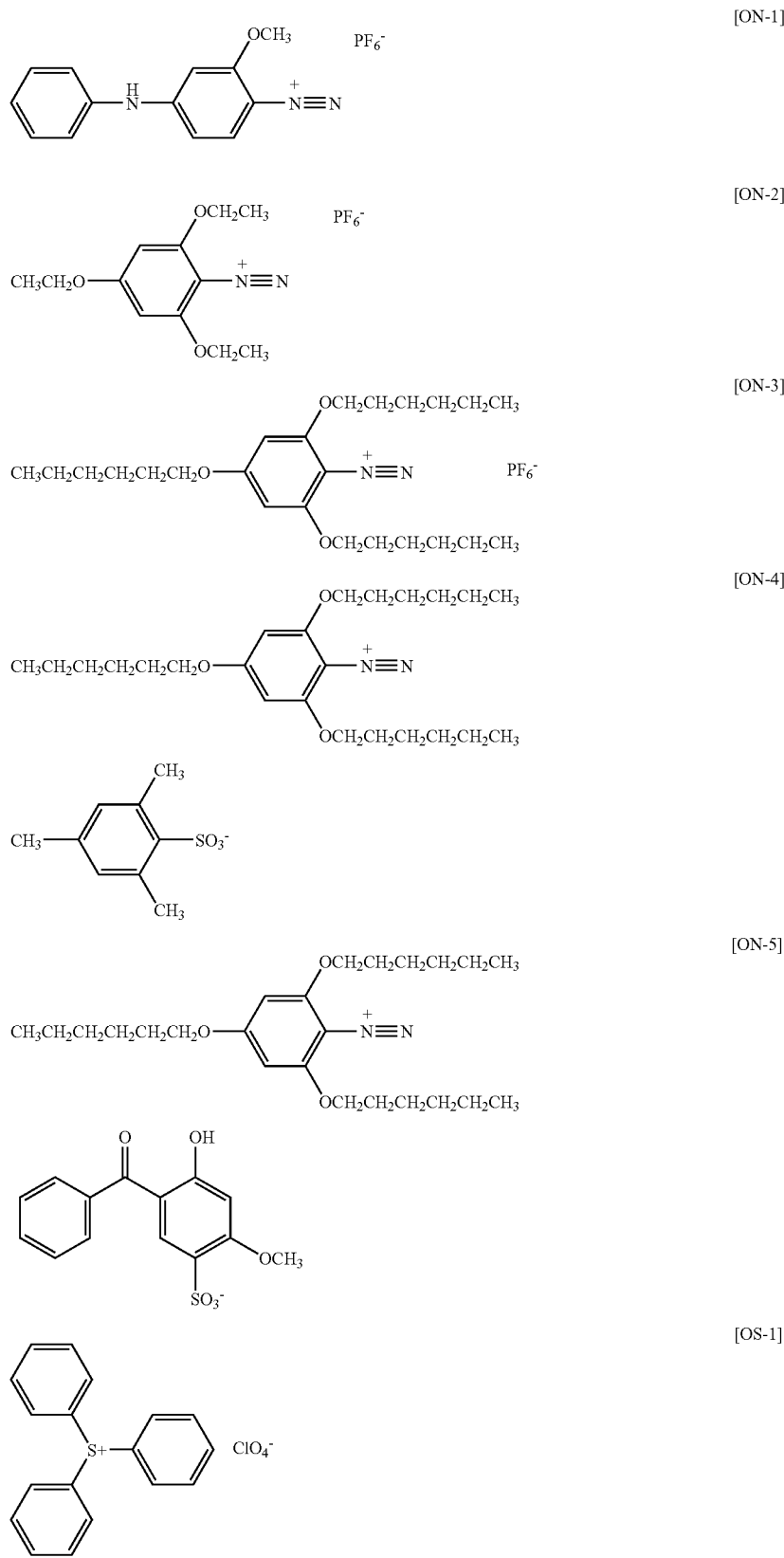

-continued
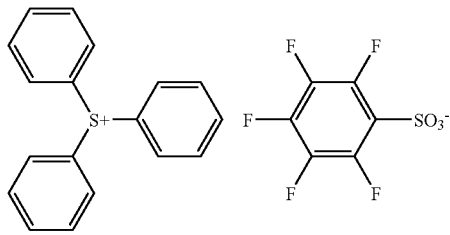 [OS-2]
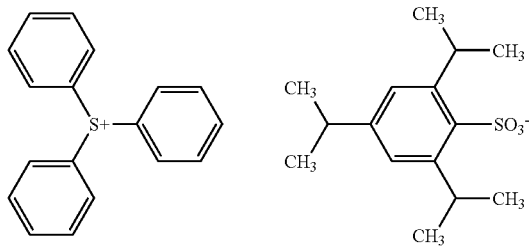 [OS-3]
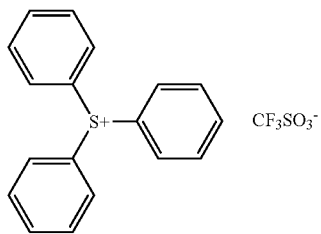 [OS-4]
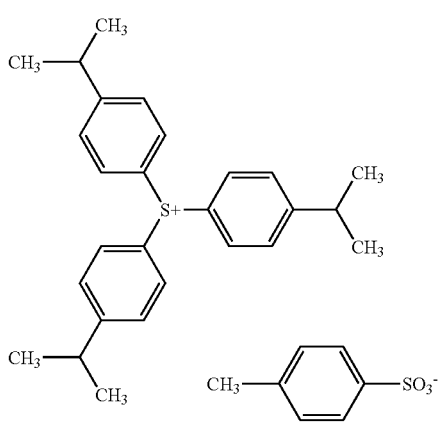 [OS-5]
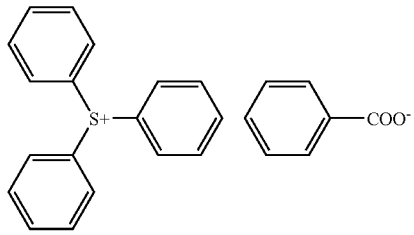 [OS-6]

-continued

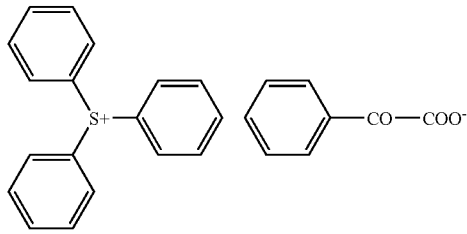

[OS-7]

Each of the radical generating agents used according to the invention, preferably has its maximum absorption wavelength of 400 nm or less and more preferably 360 nm or less. By setting the absorption wavelength in an ultraviolet ray region as specified above, the image recording material can be handled under an white light.

These radical generating agents can be added in the image recording material, based on the total solid content of the image recording material, at a rate of preferably ranging from 0.1% by mass to 50% by mass, more preferably ranging from 0.5% by mass to 30% by mass and particularly preferably ranging from 1% by mass to 20% by mass These radical generating agents may be used either alone or in combinations of two types or more. Further, these radical generating agents may be added to the same layer along with any other component or added to a separately provided layer.

(C) Radical Polymerizable Compound

The radical polymerizable compound to be used according to the invention is a radical polymerizable compound having at least one ethylenically unsaturated double bond and is selected from the group consisting of compounds which have at least one, preferably two or more, terminal ethylenically unsaturated bonds. Such group of compounds are widely known in the relevant industrial field and can be used in the invention without particular limitation. These compounds are in a chemical state of a monomer, a prepolymer, that is, a dimmer, a trimer, an oligomer, mixtures thereof, copolymers thereof or the like. Examples of such monomers and copolymers include unsaturated carboxylic acids (for example, acrylic acid, methacrylic acid, itaconic acid, crotonic acid, isocrotonic acid and maleic acid), esters thereof and amides thereof. Preferably, an ester of the unsaturated carboxylic acid and an aliphatic polyhydric alcohol compound and amides of the unsaturated carboxylic acid and an aliphatic polyvalent amino compound are used. Further, an addition reaction product of an unsaturated carboxylic acid ester having a nucleophilic substituent such as a hydroxyl group, an amino group and a mercapto group or amides and a momofunctional or polyfunctional isocyanates or epoxies are favorably used. A dehydration-condensation reaction product of such ester or amines and a monofunctional or polyfunctional carboxylic acid, and the like are also favorably used. Further, an addition reaction product of an unsaturated carboxylic acid ester having an electrophilic substituent such as an isocyanato group and an epoxy group or amides and a monofunctional or polyfunctional alcohols, amines and thiols are also favorably used. Still further, a substitution reaction product of an unsaturated carboxylic acid ester having a substituent,which leaves easily, such as a halogen group, a tosyloxy group and the like or amides and a monofunctional or polyfunctional alcohols, amines and thiols are also favorably used. As an alternative example, a group of compounds in which an unsaturated phosphonic acid, styrene or the like is employed in place of the unsaturated carboxylic acid can also be used.

Specific examples of radical polymerizable compounds which are each an ester of an aliphatic polyhydric alcohol compound and an unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate and a polyester acrylate oligomer; methacrylic acid esters such as tetramethylene glycol dimethacrylate, triethylene glycol dimethacrylate, neopentyl glycol dimethacrylate, trimethylolpropane trimethacrylate, trimethyloletmane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy) phenyl]dimethylmethane and bis-[p-(methacryloxyethoxy) phenyl]dimethylmethane; itaconic acid esters such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate; crotonic acid esters such as ethylene glycol dicrotonate, tetramethylene glycol dicrotonate, pentaerythritol dicrotonate and sorbitol tetradicrotonate; isocrotonic acid esters such as ethylene glycol diisocrotonate, pentaerythritol diisocrotonate and sorbitol tetraisocrotonate; maleic acid esters such as ethylene glycol dimaleate, triethylene glycol dimaleate, pentaerythritol dimaleate and sorbitol tetramaleate; and other esters to be favorably used such as aliphatic alcohol-based esters as described in JP-B Nos. 46-27926 and 51-47334, JP-A No. 57-196231, esters having an aromatic skeleton as described in JP-A Nos. 59-5240, 59-5241 and 2-226149 and those having an amino group as described in JP-A No. 1-165613.

Further, specific examples of monomers of amides of aliphatic polyamine compounds and unsaturated carboxylic acids include methylene-bis-acrylamide, methylene-bis-methacrylamide, 1,6-hexamethylene-bis-acrylamide, 1,6-hexamethylene-bis-methacrylamide, diethylenetriaminetrisacrylamide, xylylenebisacrylamide and xylylenebismethacrylamide. As for other favorable examples of amide-based monomers, mentioned are those having a cyclohexylene structure as described in JP-B No. 54-21726.

Further, a urethane-type addition-polymerizable compound prepared by an addition reaction between an isocyanate and a hydroxyl group is also favorable. Examples of such uretane-type addition-polymerizable compounds include a vinyl urethane compound, having two or more polymerizable vinyl groups in one molecule, which is obtained by adding a vinyl monomer having a hydroxyl group represented by the following formula (IV) to a polyisocyanate compound having two or more isocyanate groups in one molecule as described in JP-B No. 48-41708:

$$CH_2=C(R^{41})COOCH_2CH(R^{42})OH \qquad (IV)$$

wherein $R^{41}$ and $R^{42}$ each individually represent H or $CH_3$.

Further, urethane acrylates as described in JP-A No. 51-37193, JP-B Nos. 2-32293 and 2-16765 and urethane compounds having an ethylene oxide-based skeleton as described in JP-B No. 58-49860, 56-17654, 62-39417 and 62-39418 are also favorable.

Still further, radical polymerizable compounds each having an amino structure or a sulfide structure in a molecule as described in JP-A Nos. 63-277653, 63-260909 and 1-105238 may be used.

Other examples are polyfunctional acrylates or methacrylates such as polyester acrylates and epoxy acrylates obtained by allowing an epoxy resin and (meth)acrylic acid to react with each other as described in JP-A No. 48-64183, JP-B Nos. 49-43191 and 52-30490; specific unsaturated compounds as described in JP-B Nos. 46-43946, 1-40337 and 1-40336; and vinylphosphoric acid-based compounds as described in JP-A No. 2-25493. Further, a structure containing a perfluoroalkyl group as described in JP-A No. 61-22048 is favorably used in some cases. Those described in Journal of the Adhesion Society of Japan, Vol. 20, No. 7, pp. 300-308 (1984) as photo-curable monomers and oligomers can also be used.

Particulars of usage of these radical polymerizable compounds as to structures and amounts to be used, whether they are used individually or in combination and the like can arbitrarily be determined according to a performance design of a final recording material. For example, the particulars are selected from viewpoints described below. From the standpoint of sensitivity, structures with a higher unsaturated group content per molecule are preferred whereupon in many cases, bi- or higher functionality is preferred. Further, in order to obtain high film strength of an image area, namely, a cured film, tri- or higher functionality is desirable. Still further, it is an effective manipulation to use a plurality of radical polymerizable compounds different in functionality or polymerizable groups (for example, acrylic acid ester-based compounds, methacrylic acid ester-based compounds and styrene-type compounds) in combination to allow both the sensitivity and the film strength to be adjusted. Radical polymerizable compounds having a large molecular weight or high hydrophobic properties are, while excellent in sensitivity and film strength, sometimes unfavorable in a developing speed or for precipitation in a developer. Further, selection of the type and usage of the radical polymerizable compound is also important factor affecting compatibility and dispersibility with other components in a recording layer (for example, a binder polymer, an initiator and a coloring agent). For example, compatibility can sometimes be improved by using a low purity compound or using two or more compounds in combination. A specific compound structure can sometimes be selected for the purpose of improving contact characteristics with a support, an overcoat layer and the like. As to compounding ratio of the radical polymerizable compound in the image recording layer, when the ratio is higher, sensitivity becomes better. Under these circumstances, the ratio of the radical polymerizable compound is, based on the total mass of components of the composition, preferably ranging from 5% by mass to 80% by mass, and more preferably ranging from 20% by mass to 75% by mass. These radical polymerizable compounds can be used either individually or in combination of two or more thereof. As for other usage of the radical polymerizable compounds, an appropriate structure, compounding and addition amount of the radical polymerizable compounds can be selected in view of degree of polymerization inhibition by oxygen, resolution power, fogging properties, changes of refractive index, surface stickiness and the like. Further, such layer structure as an undercoat or an overcoat topcoat or a coating method can appropriately be selected in connection with the usage of the radical polymerizable compounds.

(D) Binder Polymer

The image recording material according to the present invention can optionally further contain a binder polymer for the purpose of, for example, improving coat characteristics of the recording layer to be formed. The binder polymer contained therein is preferably a linear organic polymer. Any known "linear organic polymer" may be used; however, in order to allow water development or alkalescent development to be performed, the linear organic polymer which is soluble or swellable in water or weak-alkaline water is preferably selected. The linear organic polymer is selected and used in accordance with the usage as a coat-forming agent of the image recording material and usage as water developer or weak-alkaline developer or organic solvent developer. For example, when a water-soluble organic polymer is used, water development can be performed. Examples of such linear organic polymers include radical polymers having a carboxylic acid group on the side chain, those as described in JP-A No. 59-44615, JP-B Nos. 54-34327, 58-12577 and 54-25957, JP-A Nos. 54-92723, 59-53836 and 59-71048, namely, methacrylic acid copolymers, acrylic acid copolymers, itaconic acid copolymers, crotonic acid copolymers, maleic acid copolymers and partially esterified maleic acid copolymers. Also, acidic cellulose derivatives similarly having a carboxylic acid group on the side chain may be used. Further, other than these, those obtained by addition of a cyclic acid anhydride to a polymer having a hydroxyl group are useful.

In particular, a (meth)acrylic resin having a benzyl group or an allyl group and a carboxyl group on a side chain, and an alkali-soluble resin having a double bond on a side chain as described in JP-A No. 2000-187322 are favorable since they are excellent in balance of layer strength, sensitivity and developability.

Further, urethane-type binder polymers containing an acid group as described in JP-B Nos. 7-120040, 7-120041, 7-120042 and 8-12424, JP-A Nos. 63-287944, 63-287947 and 1-271741, and Japanese Patent Application No. 10-116232 are by far excellent in strength and, accordingly, advantageous in points of printing durability and suitability to low intensity exposure.

Other than those, polyvinyl pyrrolidone, polyethylene oxide and the like are useful as the water-soluble linear organic polymer. For the purpose of increasing the strength of cured coat, an alcohol-soluble nylon, a polyether of 2,2-bis-(4-hydroxyphenyl)-propane with epichlorohydrin and the like are also useful.

A mass average molecular weight of the polymer used according to the invention is preferably 5000 or more and more preferably in the range from 10000 to 300000 while a number average molecular weigh thereof is preferably 1000 or more and more preferably in the range from 2000 to 250000. A degree of polydispersity (mass average molecular weight/number average molecular weight) is preferably 1 or more and more preferably in the range from 1.1 to 10.

These polymers may be any one polymer selected from the group consisting of a random polymer, a block polymer, a graft polyme and other appropriate polymers; however, the random polymer is preferable there among.

The polymers used according to the invention can be synthesized by a conventionally known method.

Examples of solvents to be used at the time of such synthesis include tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetoamide, toluene, ethyl acetate, methyl lactate, ethyl lactate, dimethyl sulfoxide and water. These solvents can be used either individually or in combination of two or more thereof.

As for radical polymerization initiators to be used at the time of syntheses of the polymers to be used according to the invention, known compounds such as an azo-type initiator, a peroxide initiator and the like can be used.

The binder polymers to be used according to the invention can be used either individually or in combinations thereof. These polymers are added in the image recording material in an amount of, based on the total solid content of the image recording material, ranging from 20% by mass to 95% by mass and preferably ranging from 30% by mass to 90% by mass. In a case in which such addition amount is less than 20% by mass, when the image is formed, an improvement effect of strength of the image area can not sufficiently be obtained, whereas, in a case in which the addition amount is more than 95% by mass, the image can not be formed. Further, a ratio of the radical polymerizable compound having an ethylenically unsaturated double bond to the linear organic polymer is preferably ranging from 1/9 to 7/3 by mass.

Other Components

According to the invention, various types of other compounds than those described above may optionally be added. For example, a dye that has large absorption in a visible light band may be used as a coloring agent. Specific examples of such dyes include Oil Yellow #101, Oil Yellow #103, Oil Pink #312, Oil Green BG, Oil Blue BOS, Oil Blue #603, Oil Black BY, Oil Black BS, Oil Black T-505 (the foregoing dyes are available from Orient Chemical Industries, Ltd.), Victoria Pure Blue, Crystal Violet (CI42555), Methyl Violet (CI42535), Ethyl Violet, Rhodamine B (CI145170B), Malachite green (CI42000) and Methylene Blue (CI52015). Further mentioned are dyes as described in JP-A No. 62-293247. Still further, pigments such as phthalocyanine-based pigments, azo-based pigments, carbon black and titanium oxide are favorably used.

It is preferable that these coloring agents are added to facilitate the discrimination of the image area from the non-image area after the image is formed. An amount of these coloring agents to be added is at a rate of, based on the total solid content of the image recording material, ranging from 0.01% by mass to 10% by mass.

Further, according to the invention, it is preferable to add a small amount of thermopolymerization inhibitor for the purpose of inhibiting unnecessary thermopolymerization of the radical polymerizable compound having an ethylenically unsaturated double bond during preparation or storage of the image recording material. Appropriate examples of such thermopolymerization inhibitors include hydroquinone, p-methoxyphenol, di-t-butyl-p-cresol, pyrogallol, t-butyl-catechol, benzoquinone, 4,4'-thiobis(3-methyl-6-t-butylphenol), 2,2'-methylenebis(4-methyl-6-t-butylphenol) and an N-nitroso-N-phenylhydroxylamine aluminum salt. An amount of the thermopolymerization inhibitor to be added is, based on the total mass of composition, preferably in an amount ranging from about 0.01% by mass to about 5% by mass. If desired, a higher fatty acid or a derivative thereof such as behenic acid or an amide of behenic acid may be added to the composition and be localized on a surface of the recording layer in a process of drying after a coating operation is performed so as to prevent polymerization inhibition by oxygen. An amount of the higher fatty acid (or the derivative thereof) to be added is preferably at a rate of about 0.1% by mass to about 10% by mass based on the total composition.

In order to improve stability of treatment under development conditions, nonionic surfactants as described in JP-A Nos. 62-251740 and 3-208514 or amphoteric surfactants as described in JP-A Nos. 59-121044 and 4-13149 can be added to the image recording material according to the present invention.

Specific examples of the non-ionic surfactants include sorbitan tristearate, sorbitan monopalmitate, sorbitan trioleate, stearic acid monoglyceride and polyoxyethylene nonylphenyl ether.

Further, specific examples of the amphoteric surfactants include alkyl di(aminoethyl)glycine, alkyl polyaminoethylglycine hydrochloride, 2-alkyl-N-carboxyethyl-N-hydroxyethyl imidazolinium betaine and N-tetradodecyl-N,N-betaine types (for example, AMOGEN K (trade name); available from Dai-ichi Kogyo Seiyaku Co., Ltd.). A ratio of the nonionic surfactant and the amphoteric surfactant to the image recording material is preferably ranging from 0.05% by mass to 15% by mass and more preferably ranging from 0.1% by mass to 5% by mass.

Further, if desired, in order to impart flexibility or the like to the film, a plasticiser may be added to the image recording material according to the invention. Examples of plasticisers include polyethylene glycol, tributyl citrate, diethyl phthalate, dibutyl phthalate, dihexyl phthalate, dioctyl phthalate, tricresyl phosphate, tributyl phosphate, trioctyl phosphate and tetrahydrofurfuryl oleate.

The above-described components of the image recording material according to the invention are ordinarily dissolved in a solvent and, then, applied on an appropriate support, thereby forming a recording layer on various types of printing plates. Examples of such solvents that may me used include ethylene dichloride, cyclohexanone, methyl ethyl ketone, methanol, ethanol, propanol, ethylene glycol monomethyl ether, 1-methoxy-2-propanol, 2-methoxy ethyl acetate, 1-methoxy-2-propyl acetate, dimethoxyethane, methyl lactate, ethyl lactate, N,N-dimethyl acetamide, N,N-dimethyl formamide, tetramethyl urea, N-methyl pyrrolidone, dimethyl sulfoxide, sulfolane, γ-butyrolactone, toluene and water; however, these examples are given to illustrate the invention and should not be interpreted as limiting the invention in any way. These solvents may be used either alone or in mixtures thereof. Concentration of the components (total solids inclusive of other additives) in the solvent is preferably ranging from 1% by mass to 50% by mass.

Further, a coated amount after applied on the support and dried is, although varying depending on the application, ordinarily ranging from 0.5 g/m$^2$ to 5.0 g/m$^2$ as to a planographic printing plate precursor is concerned.

As for coating methods, various types of techniques can be utilized. Examples of the techniques include bar coater coating, rotary coating, spray coating, curtain coating, dip coating, air knife coating, blade coating and roll coating.

In order to improve coating ability, surfactants such as fluorine-based surfactants described in JP-A No. 62-170950 can be added to the image recording material according to the invention. An amount of such addition is, based on the total solid content of the image recording material, preferably ranging from 0.01% by mass to 1% by mass and more preferably ranging from 0.05% by mass to 0.5% by mass.

The image recording material according to the invention obtained in a manner as described above is excellent in raw stock storability whereby the material can favorably be used in various types of printing plates (planographic printing plates, color proofs, photoresists, color filters and the like) on which an image can be recorded by infrared ray irradiation. Hereinafter, particularly the planographic printing plate (precursor) among the above-described printing plates which use the image recording material according to the invention will be described in detail.

Resin Intermediate Layer

In the planographic printing plate precursor in which the image recording material according to the invention is used as a recording layer, a resin intermediate layer can optionally be provided between the support and the recording layer.

By providing the resin intermediate layer between the support and the recording layer, the resin intermediate layer comprising a polymer functions as a heat insulating layer thereof and the heat released by exposure of an infrared ray laser is not dissipated into the support and can be efficiently utilized, accordingly there is an advantage in that higher sensitization can be planned.

Further, when the resin intermediate layer is provided, the recording layer comprising the image recording material according to the invention is positioned on a surface to be exposed or in a neighborhood thereof whereby sensitivity to the infrared ray laser can favorably be maintained.

Still further, in the exposed area, it is considered that, since the recording layer having sensitivity to the infrared ray which has been changed to be impermeable to an alkali developer functions as a protective layer for the resin intermediate layer, development stability becomes favorable, the image excellent in discrimination is formed and, further, stability over time is secured. On the other hand, in the unexposed area, it is considered that, since unexposed binder components quickly dissolve and dissipate in the developer and also the resin intermediate layer positioned adjacent to the support comprises an alkali-soluble polymer, solubility to the developer is excellent. For example, even when a developer having a low activity is used, the unexposed binder components quickly dissolve in the developer without leaving a left-over film or the like whereupon favorable developing ability is secured.

Overcoat Layer

In the planographic printing plate precursor in which the image recording material according to the invention is used, an overcoat layer can optionally be provided on the recording layer. While exposure of the image recording material is ordinarily performed in the air, a low molecular-weight compound, such as oxygen, a basic substance or the like present in the air which inhibits an image forming reaction to be generated by exposure in the recording layer cannot enter the recording layer, thereby the image forming reaction caused by exposure in the air is secured from interferences, thanks to the existance of the overcoat layer. Therefore, as for characteristics required for the overcoat layer, it is desirable that the overcoat layer has a low permeability to the low molecular-weight compound such as oxygen or the like, has excellent transmittance to light for use in the exposure, has excellent adhesion to the recording layer and, further, is easily removed in a developing process after the exposure.

Many improvements have been attempted on the overcoat layer; particulars thereof are described in U.S. Pat. No. 3,458,311 and JP-A No. 55-49729. A material which can be used for the overcoat layer is preferably a water-soluble polymer compound having relatively excellent crystallinity. More specifically, as for such water-soluble polymers, for example, polyvinyl alcohol, polyvinyl pyrrolidone, acidic celluloses, gelatin, gum arabic and polyacrylic acid are known. Among these, by using polyvinyl alcohol as a main component, most advantageous results can be obtained regarding the fundamental properties such as an oxygen barrier property and development eliminating property. The polyvinyl alcohol for use in the overcoat layer may be partially displaced by ester, ether or acetal as long as it contains an unsubstituted vinyl alcohol unit necessary for ensuring the oxygen barrier property and water solubility. Furthermore, a part of the polyvinyl alcohol may contain other copolymer components.

Specific examples of polyvinyl alcohol have a hydrolysis ratio ranging from 71% to 100% and a molecular weight in the range from 300 to 2,400 can be cited. Specific examples of such polyvinyl alcohol include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8, (the foregoing being available from Kuraray Co., Ltd.). Components of the overcoat layer (for example, selection of PVA, use of additives) and the coated amount thereof are selected by taking into consideration not only the oxygen barrier property and development removability but also a fogging property, contact characteristics and scratch resistance. Ordinarily, the higher the hydrolysis ratio of PVA used (the higher a content of the unsubstituted vinyl alcohol unit in the overcoat layer) is and the thicker the layer is, the higher the oxygen barrier property is, which is advantageous in view of sensitivity. However, when the oxygen barrier property is extremely elevated, there arise problems in that, for example, unnecessary polymerization reaction may proceed during production or during a period of raw stock storage or unnecessary fogging or an fatter image line may occur at the time of image exposure. Further, contact characteristics with the image area and the scratch resistance are also very important in view of handling of the plate. To speak more specifically, when a hydrophilic layer comprising a water-soluble polymer is overcoated on a lipophilic polymer layer, layer separation is liable to occur due to insufficient adhesion strength and the resultant separated part causes defects such as layer curing failure due to polymerization inhibition by oxygen.

In order to improve contact characteristics between these two layers, various improvements have been proposed. For example, U.S. patent application Nos. 292,501 (filed on Sep. 27, 1972) and 44,563 (filed on Jun. 8, 1970) describe a technique of mixing from 20% by mass to 60% by mass of an acrylic emulsion or a water-insoluble vinyl pyrrolidone-vinyl acetate copolymer in a hydrophilic polymer mainly comprising polyvinyl alcohol and then overcoating the resultant mixture on the polymerization layer, thereby obtaining a sufficiently strong adhesion. Any of these known techniques may be applied to the overcoat layer according to the invention. An application method of the overcoat layer is described in detail, for example, in U.S. Pat. No. 3,458,311 and JP-A No. 55-49729.

Further, the overcoat layer may also be imparted with other functions. For example, by adding a coloring agent (for example, water-soluble dye) capable of showing excellent transmittance of light (for example, in a case of the image recording material according to the invention, infrared ray at a wavelength ranging from about 760 nm to about 1200 nm) used for the exposure and also efficiently absorbing light having a wavelength which is not concerned with the exposure, suitability to safe light can be more elevated without causing any reduction in the sensitivity.

Support

As for supports which can be coated with the image recording material according to the invention, a dimensionally stable tabular material is mentioned. Examples of such dimensionally stable tabular materials include paper, paper laminated with plastic (for example, polyethylene, polypropylene, polystyrene), metal sheet (for example, aluminum, zinc, copper), plastic film (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal), and paper or plastic film on which such metals as described above are laminated or vapor-deposited.

In particular, as for the supports for use in the planographic printing plate precursor using the image recording material according to the invention, polyester films and aluminum plates are preferable and, among these, the aluminum plates are particularly preferable because they have good dimensional stability and is relatively inexpensive. The aluminum plate is preferably a plate of pure aluminum or alloy mainly comprising aluminum and containing a trace amount of a hetero-element. Plastic films on which aluminum is laminated or vapor-deposited is also permissible. Examples of such hetero-elements contained in the aluminum alloy include silicon, iron, manganese, copper, magnesium, chromium, zinc, bismuth, nickel and titanium. An amount of the hetero-element contained in the alloy is at most 10% by mass or less. According to the invention, particularly preferable aluminum is pure aluminum, but, since completely pure aluminum is difficult to produce in view of the refining technique, aluminum containing a slight amount of hetero-elements may be used. A composition of the aluminum plate applied to the invention is not particularly limited and an aluminum plate conventionally known as a raw material may appropriately be used. The aluminum plate for use in the invention has a thickness ranging from about 0.1 mm to about 0.6 mm, preferably ranging from 0.15 mm to 0.4 mm and particularly preferably ranging from 0.2 mm to 0.3 mm.

Prior to subjecting the aluminum plate to a surface roughening treatment, a degreasing treatment for removing rolling oil from a surface thereof may optionally be performed by, for example, a surfactant, an organic solvent or an alkali aqueous solution.

The surface roughening treatment of the aluminum plate is performed by various methods, for example, a method of mechanically roughening the surface, a method of electrochemically dissolving and roughening the surface and a method of selectively dissolving the surface in a chemical manner. As for the mechanical roughening method, known methods such as ball polishing, brush polishing, blast polishing and buff polishing can be used. As for the electrochemical roughening method, roughening can be performed in an electrolytic solution such as hydrochloric acid or nitric acid by allowing alternate current or direct current to flow. These two roughening methods may also be used in combination as described in JP-A No. 54-63902.

The aluminum plate thus subjected to the surface roughening treatment is optionally subjected to an alkali etching treatment and a neutralization treatment and, then, subjected to anodic oxidation treatment for the purpose of enhancing a water retention property or abrasion resistance. As for electrolytes for use in the anodic oxidation treatment of the aluminum plate, various types of electrolytes which form porous oxide film can be used. As for such electrolytes, ordinarily, sulfuric acid, phosphoric acid, oxalic acid, chromic acid or mixed acids thereof are used. Concentrations of these electrolytes are each appropriately determined depending on the type of the electrolyte.

Conditions of the anodic oxidation treatment vary depending on the electrolyte to be used so it is difficult to specify them as a fixed condition. However, ordinarily, it is appropriate that a concentration of a solution of the electrolyte is in the range from 1% by mass to 80% by mass; a temperature of such solution is in the range from 5° C. to 70° C.; current density is in the range from 0.5 $A/dm^2$ to 60 $A/dm^2$; voltage is in the range from 1V to 100 V; and an electrolysis time period is in the range from 10 seconds to 5 minutes.

After the aluminum plate is subjected to the anodic oxidation treatment, a surface of the thus treated aluminum plate is optionally subjected to a hydrophilizing treatment. As for the hydrophilizing treatment, mentioned is a method of using alkali metal silicate(for example sodium silicate solution) as described in U.S. Pat. Nos. 2,714,066, 3,181,461, 3,280,734 and 3,902,734. According to this method, the support is subjected to a dipping treatment in an aqueous sodium silicate solution or to an electrolysis treatment. Other than those treatments described above, a treatment by using potassium fluorozirconate as described in JP-B No.36-22063 and another treatment by using polyvinyl phosphonate as described in U.S. Pat. Nos. 3,276,868, 4,153,461 and 4,689,272 and the like can be used.

In the planographic printing plate precursor using the image recording material according to the invention, an undercoat layer may optionally be provided between the support and the recording layer (or the resin intermediate layer).

Various types of organic compounds are used as components in the undercoat layer; examples of the organic compounds include carboxymethyl cellulose, dextrin, gum arabic, organic phosphonic acids having an amino group such as 2-aminoethylphosphonic acid, organic phosphonic acids which may have a substituent such as phenylphosphonic acid, naphthylphosphonic acid, an alkylphosphonic acid, glycerophosphonic acid, methylenediphosphonic acid and ethylenediphosphonic acid; organic phosphoric acids which may have a substituent such as phenylphosphoric acid, naphthylphosphoric acid, an alkylphosphoric acid and glycerophosphoric acid; organic phosphinic acids which may have a substituent such as phenylphosphinic acid, naphthylphosphinic acid, an alkylphosphinic acid and glycerophosphinic acid; amino acids such as glycine and β-alanine; and amine hydrochlorides having a hydroxyl group such as triethanolamine hydrochloride. These organic compounds can be used either individually or as mixtures of two or more thereof.

After the surface of the support is subjected to these treatments and provided with the undercoat layer and the like, a back coat may optionally be provided on a back surface of the support. As for such back coat, a coating layer comprising an organic polymer compound as described in JP-A No. 5-45885 or a metal oxide obtained by hydrolyzing and condensation polymerizing an organic or inorganic metal compound as described in JP-A No. 6-35174 is preferably used. Among the above-described coating layers, alkoxy compounds of silicon such as $Si(OCH_3)_4$, $Si(OC_2H_5)_4$, $Si(OC_3H_7)_4$ and $Si(OC_4H_9)_4$ are inexpensively available and a coated layer of the metal oxide obtained from these compounds is excellent in resistance to the developer, thereby being particularly favorable.

As for preferable characteristics as the support for the planographic printing plate, centerline average surface roughness is in a range from 0.10 μm to 1.2 μm. When the centerline average surface roughness is less than 0.10 μm, contact characteristics with the recording layer is reduced, thereby remarkably reducing printing durability. On the other hand, when it is more than 1.2 μm, stain resistance at the time of printing is deteriorated. Further, as for color density of the support, a reflection density value is in a range from 0.15 to 0.65. When it is whiter than 0.15, halation at the time of image exposure is unduly strong, thereby causing a problem in forming the image, while, when it is darker than 0.65, the image is hard to be observed at the time of checking the printing plates, thereby causing a problem that checking the printing plate becomes extremely difficult.

The planographic printing plate using the image recording material according to the invention can be produced in a manner as described above. The thus-produced planographic printing plate can be recorded by an infrared ray laser or an ultraviolet ray lamp. Thermal recording by a thermal head is also possible. According to the invention, it is preferable that image exposure is performed by a solid laser or a semiconductor laser which emits an infrared ray in a wavelength ranging from 760 nm to 1200 nm. An output of the laser is preferably 100 mW or more and, for the purpose of reducing an exposure time period, a multi-beam laser device is preferably employed. Further, the exposure time period per pixel is preferably 20 microseconds or less. Energy to be irradiated on the recording material is preferably ranging from 10 $mJ/cm^2$ to 300 $mJ/cm^2$.

After being exposed by the infrared ray laser, the planographic printing plate using the image recording material according to the invention is developed, preferably, by water or an alkaline aqueous solution.

According to the invention, a development may be performed immediately after a laser irradiation is conducted, but it is also possible to provide a heating treatment process between such laser irradiation process and development process. Heating treatment is preferably performed under conditions in a range from 80° C. to 150° C. for from 10 seconds to 5 minutes. By this heating treatment, a laser energy necessary for recording can be reduced at the time of the laser irradiation.

As for developers, an alkaline aqueous solution is preferable whereupon, as for preferable pH ranges, mentioned is a pH range from 10.5 to 12.5 and, further, it is preferable to perform the development process by using the alkaline aqueous solution in a pH range from 11.0 to 12.5. When the development process is performed by the alkaline aqueous solution having a pH value of less than 10.5, a stain is liable to be generated in the non-image area, while, when the development process is performed by the alkaline aqueous solution having a pH value of more than 12.5, there is a risk of reducing strength of the image area.

As for the developers and replenishers thereof for the planographic printing plate using the image recording material according to the invention in a case in which the alkaline aqueous solution is used as the developer, conventional alkaline aqueous solutions can be used. Examples of alkaline substances employed in such alkaline aqueous solutions include inorganic alkali salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, potassium hydroxide, ammonium hydroxide, and lithium hydroxide; and organic alkaline chemicals such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethnanolamine, monoisopropanolamine, diisopropanolamine, ethyleneimine, ethylenediamine, and pyridine. These alkaline chemicals can be used either individually or in combination of two or more thereof.

Further, it is known that, when an automatic processor is used for development, by supplementing a same developer or an aqueous solution (replenisher) having a higher alkalinity than that of the developer to the developer in use, a great number of planographic printing plates can be treated without changing the developers in a development tank for a long period of time. Also in the invention, such method of supplementaion can favorably be adopted.

In the developer and the replenisher, for the purpose of enhancement or suppression of the development performance, of dispersion of development scum and of ink receptivity of the image area of the printing plate, if desired, various types of surfactants, organic solvents and the like can be added.

In the developer, the surfactant is added in an amount of preferably ranging from 1% by mass to 20% by mass and more preferably ranging from 3% by mass to 10% by mass. When the amount of the surfactant to be added is less than 1% by mass, an enhancement effect of the development performance is only insufficientlyobtained, while, when the amount of the surfactant is over 20% by mass, adverse effects such as decrease of strength of the image such as abrasion resistance tend to appear.

As for the preferable surfactants, mentioned are anionic, cationic, nonionic and amphoteric surfactants. Specific examples of such surfactants include sodium lauryl alcohol sulfate; ammonium lauryl alcohol sulfate; sodium octyl alcohol sulfate; alkylarylsulfonates such as sodium isopropylnaphtalene sulfonate, sodium isobutylnaphtalene sulfonate, a sodium salt of polyoxyethylene glycol mononaphthyl ether sulfuric acid ester, sodium dodecylbenzene sulfonate and sodium m-nitrobenzene sulfonate; higher alcohol sulfuric acid esters each having 8 to 22 carbon atoms such as a sodium secondary alkylsulfate; salts of aliphatic alcohol phosphoric acid esters such as a sodium salt of cetyl alcohol phosphoric acid ester; alkylamide sulfonates such as $C_{17}H_{33}CON(CH_3)CH_2CH_2SO_3Na$; dibasic aliphatic ester sulfonates such as sodium sulfosuccinic dioctyl ester and sodium sulfosuccinic dihexyl ester; ammonium salts such as lauryl trimethyl ammonium chloride and lauryl trimethyl ammonium methosulfate; amine salts such as stearamide ethyl diethylamine acetate; polyhydric alcohols such as glycerol monofatty acid ester and pentaerythritol monofatty acid ester; and polyethylene glycol ethers such as polyethylene glycol mononaphthyl ether and polyethylene glycol mono(nonylphenol) ether.

As for preferable organic solvents, mentioned are those having solubility to water of about 10% by mass or less. More preferable organic solvents are selected from the group consisting of those having solubility to water of 5% by mass or less. Examples of such organic solvents include 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, benzyl alcohol, cyclohexanol, 2-methylcyclohexanol, 4-methylcyclohexanol and 3-methylcyclohexanol. An amount of the organic solvent to be contained is, based on the total mass of the developer in use, favorably ranging from 1% by mass to 5% by mass. The amount of the organic solvent used is closely related with that of the surfactant to be used whereupon it is preferable to increase the amount of the surfactant, as the amount of the organic solvent is increased. This is because that, when a large amount of organic solvent is used in a state in which the amount of the surfactant is small, the organic solvent does not dissolve whereupon securing of a favorable developing property can not be expected.

Further, other additives such as an antifoaming agent and a water softener can optionally be added in the developer and the replenisher. Examples of such water softener include polyphosphates such as $Na_2P_2O_7$, $Na_5P_3O_3$, $Na_3P_3O_9$, $Na_2O_4P(NaO_3P)PO_3Na_2$ and CALGON (trade name) (sodium polymetaphosphate); aminopolycarboxylic acid salts such as ethylene diamine tetraacetic acid, a potassium salt thereof and a sodium salt thereof, diethylene triamine pentaacetic acid, a potassium salt thereof and a sodium salt thereof, triethylene tetramine hexaacetic acid, a potassium salt thereof and a sodium salt thereof, hydroxyethyl ethylene diamine triacetic acid, a potassium salt thereof and a sodium salt thereof, nitrilotriacetic acid, a potassium salt thereof and a sodium salt thereof, 1,2-diaminocyclohexane tetraacetic acid, a potassium salt thereof and a sodium salt thereof, and 1,3-diamino-2-propanol tetraacetic acid, a potassium salt thereof and a sodium salt thereof; organic phosphonates such as 2-phosphonobutane tricarboxylic acid-1,2,4, a potassium salt thereof and a sodium salt thereof, 2-phosphonobutanone tricarboxylic acid-2,3,4, a potassium salt thereof and a sodium salt thereof, 1-phosphonoethane tricarboxylic acid-1,2,2, a potassium salt thereof and a sodium salt thereof, 1-hydroxyethane-1,1-diphosphonic acid, a potassium salt thereof and a sodium salt thereof, and aminotri (methylene phosphonic acid), a potassium salt thereof and a sodium salt thereof. An optimum amount of these water softener vary according to hardness and an amount of hard water to be used; however, ordinarily, the water softener are each allowed to be contained in the developer in use in the range from 0.01% by mass to 5% by mass and preferably from 0.01% by mass to 0.5% by mass.

Further, when the planographic printing plate is developed by using the automatic processor, the developer becomes exausted as a number of processed printing plates is increased. Processing ability may be recovered by using the replenisher or a fresh developer. On this occasion, the developer is replenished preferably by using a method as described in U.S. Pat. No. 4,882,246.

Examples of the developers containing these surfactants, organic solvents, reducing agents and the like include a developer composition as described in JP-A No. 51-77401 which comprises benzyl alcohol, an anionic surfactant, an alkaline chemicals and water; another developer composition as described in JP-A No. 53-44202 which comprises benzyl alcohol, an anionic surfactant and an aqueous solution containing a water-soluble sulfite; and still another developer composition as described in JP-A No. 55-155355 which comprises an organic solvent having a solubility to water of 10% by mass or less at room temperature, an alkaline chemicals and water. These developer compositions are also favorably used for the invention.

The printing plate, after being developed by using the developer and the replenisher as described above, is subjected to a post-treatment by a treatment with washing water, a treatment with a rinsing solution containing a surfactant or the like, or a treatment with a desensitizing solution containing gum arabic or a starch derivative. As for the post-treatment in which the image recording material according to the invention is used as the planographic printing plate precursor, a combination of these treatments may be employed as the post-treatment.

In recent years, particularly in printing plate-making and printing industries, automatic processors for printing plate materials have been widely used for the rationalization and standardization of plate-making operations. The automatic processor is generally made up of a development part and a post-treatment part and is provided with a device for transferring a printing plate material and with a tank for each treatment solution and a spraying device, in which the printing plate after exposure travels horizontally so that it is subjected to a development process by being sprayed from a spray nozzle with treatment solutions moved up by pumps. Further, a method in which a printing plate material is immersed in a treatment tank filled with a treatment solution by means of submerged guide rolls or the like has been known. In the above-mentioned automatic processing, the treatment can be proceeded while replenishers are supplied to the each treatment solution in accordance with treated volume and operational time. Further, the replenisher can be automatically supplied by sensing electric conductivity by a sensor. Still further, a treatment by using a practically unused treatment solution, that is, a single-use method can also be adopted.

The planographic printing plate using the image recording material according to the invention obtained as described above is, if desired, coated with a desensitizing gum and, then, can be provided to a printing process. However, when it is desired to impart a higher level of printing resistance to the printing plate, the printing plate may be subjected to a burning treatment.

When the printing plate undergoes a burning treatment, it is preferable to treat the printing plate with a surface conditioning liquid which is described in JP-B Nos. 61-2518 and 55-28062 and JP-A Nos. 62-31859 and 61-159655, prior to the burning treatment.

According to these methods, the planographic printing plate is coated with a surface conditioning liquid by means of sponge or absorbent cotton soaked with the solution; the planographic printing plate is immersed in a vat filled with the surface conditioning liquid; or the planographic printing plate is coated with the surface conditioning liquid by means of an automatic coater. When the amount coated is equalized by squeezing or using squeezing rollers after the coating, a better result is obtained. It is appropriate that an amount of the surface conditioning liquid to be applied is ordinarily in the range from 0.03 mg/m$^2$ to 0.8 mg/m$^2$ (dry mass).

The planographic printing plate, after being coated with the surface conditioning liquid, is dried, if necessary. Then, it is heated to a high temperature by means of a burning processor (for example, Burning Processor BP-1300 available from Fuji Photo Film Co., Ltd.). The temperature and time vary depending on the types of the components forming the image, but preferable temperature and time are those in the range from 180° C. to 300° C. and in the range from 1 minute to 20 minutes, respectively.

After the burning process, the planographic printing plate may appropriately be subjected to conventionally employed treatments such as water-washing and gum-coating. However, when the surface conditioning liquid contains a water-soluble polymer compound or the like, a so-called desensitizing treatment such as gum-coating may be omitted.

The planographic printing plate using the image recording material according to the invention obtained by the treatments described above is applied to an offset printing machine or the like and used for printing a great number of prints.

EXAMPLES

The examples are given below to illustrate the invention and should not be interpreted as limiting it in any way.

Examples 1 to 5 and Comparative Examples 1 to 3

Preparation of Support

A molten metal of an alloy compliant with JIS A1050 which comprises 99.5% or more of aluminum, 0.30% of Fe, 0.10% of Si, 0.02% of Ti and 0.013% of Cu was cast after being subjected to a cleaning treatment. In such cleaning treatment, a degassing treatment was conducted to remove unnecessary gasses such as hydrogen from the molten metal and, then, a ceramic tube filter treatment was conducted. As for a casting method, DC casting method was adopted. The resultant solidified ingot having a plate thickness of 500 mm was faced by a portion of 10 mm thick from a surface thereof and, then, subjected to a homogenizing treatment at 550° C. for 10 hours in order to prevent an intermetallic compound from being agglomerated.

Subsequently, the thus-homogenized ingot was hot rolled at 400° C. and, then, annealed in a continuous annealing furnace at 500° C. for 60 seconds and, thereafter, cold rolled to prepare an aluminum rolled plate having a thickness of 0.30 mm, while a centerline average surface roughness Ra after the cold rolling was controlled to be 0.2 μm by controlling roughness of a rolling roll. Thereafter, in order to enhance planarity of the thus-prepared aluminum plate, it was processed by a tension leveler.

Then, the resultant aluminum plate was subjected to a surface treatment to allow it to be a support for the planographic printing plate.

First, the aluminum plate was subjected to a degreasing treatment in a 10% aqueous solution of sodium aluminate at 50° C. for 30 seconds in order to remove rolling oil from a surface thereof and, then, subjected to a neutralizing treatment in a 30% aqueous solution of sulfuric acid at 50° C. for 30 seconds followed by a desmutting treatment.

Secondly, in order to improve contact characteristics characteristics between the support and the recording layer and, also, to provide a water-retention property to the non-image area, a treatment of roughening the surface of the support, that is, a graining treatment was performed. On this occasion, an electrolytic graining treatment was conducted such that an electric current density of 20 A/dm$^2$ in an alternate waveform of duty ratio of 1:1 were applied on an anode side and a quantity of electricity of 240 C/dm$^2$ was given to the anode by an indirect power feeding cell while an aluminum web was allowed to pass through in an aqueous solution, containing 1% nitric acid and 0.5% aluminum nitrate, which was held at 45° C. Thereafter, an etching treatment was conducted in a 10% aqueous solution of sodium aluminate at 50° C. for 30 seconds and, then, the neutralizing treatment was conducted in a 30% aqueous solution of sulfuric acid at 50° C. for 30 seconds followed by the desmutting treatment.

Further, in order to enhance abrasion resistance, chemical resistance and the water-retention property, an oxide film was formed on the support by anodic oxidation. On this occasion, the anodic oxide film of 2.5 g/cm$^2$ was formed by conducting an electrolysis treatment in which a direct current of 14 A/dm$^2$ was applied by the indirect electric supply cell while the aluminum web was allowed to pass through in an electrolyte that is a 20% aqueous solution of sulfuric acid at 35° C.

Thereafter, in order to secure hydrophilicity as the non-image area of the printing plate, a silicate treatment was conducted. On this occasion, the aluminum web was allowed to pass through in a 1.5% aqueous solution of No. 3 sodium silicate held at 70° C. such that the aluminum web contacted the solution for a 15 seconds and, then, rinsed with water. An amount of Si adhered was 10 mg/m$^2$. The Ra (centerline average surface roughness) of the support prepared in a manner as described above was 0.25 μm.

Next, each of the resulting aluminum supports was coated with an undercoat solution as described below by a wire bar and dried at 90° C. for 30 seconds by using a hot-air dryer. A coated amount thereof after drying was 10 mg/m$^2$.

Undercoat Solution

| | |
|---|---|
| Copolymer of ethyl methacrylate and sodium 2-acrylamide-2-methyl-1-propane sulfonate (copolymerization molar ratio of 75:15) | 0.1 g |
| 2-Aminoethyl phosphonic acid | 0.1 g |
| Methanol | 50 g |
| Ion-exchanged water | 50 g |

Formation of Recording Layer

Next, a coating solution for a photosensitive layer [P] as described below was prepared and, immediately after such preparation, was applied on such undercoated aluminum plate by using the wire bar and, then, dried at 115° C. for 45 seconds by using the hot-air dryer to obtain negative-type planographic printing plate precursors [P-1] to [P-5] and [Q-1] to [Q-3]. A coated amount thereof after drying was 1.3 g/m$^2$. Infrared ray absorbing agents and radical generating agents used on this occasion are shown in Table 8. Further, when a reflection density at an absorption maximum in an infrared ray region of the recording layer of each of these planographic printing plate precursors was measured, it was always within a range from 0.6 to 1.2.

Coating Solution for Photosensitive Layer [P]

| Coating solution for Photosensitive Layer [P] | |
|---|---|
| Infrared ray absorbing agent (compounds shown in Table 8) | 0.10 g |
| Radical generating agent (compounds shown in Table 8) | 0.30 g |
| Dipentaerythritol hexaacrylate | 1.00 g |
| Copolymer of allylmethacrylate and methacrylic acid (copolymerization molar ratio of 80:20; mass average molecular weight of 120000) | 1.00 g |
| Naphthalene sulfonate of Victoria Pure Blue | 0.04 g |
| Fluorine-based surfactant (MEGAFAC F-176: trade name; available from Dainippon Ink and Chemicals, Inc.) | 0.01 g |
| Methyl ethyl ketone | 9.0 g |
| Methanol | 10.0 g |
| 1-Methoxy-2-propanol | 8.0 g |

TABLE 8

| | Planographic Printing Plate Precursor | Infrared Ray Absorbing Agent | Radical Generating Agent |
|---|---|---|---|
| Example 1 | P-1 | IR-1 | OI-5 |
| Example 2 | P-2 | IR-3 | OI-5 |
| Example 3 | P-3 | IR-4 | ON-2 |
| Example 4 | P-4 | IR-6 | OS-4 |
| Example 5 | P-5 | IR-2 | OS-6 |
| Comparative Example 1 | Q-1 | IR-50 | OI-5 |
| Comparative Example 2 | Q-2 | IR-51 | ON-2 |
| Comparative Example 3 | Q-3 | IR-52 | OS-6 |

Further, a structure of the infrared ray absorbing agents used in Comparative Examples 1 to 3 is as follows:

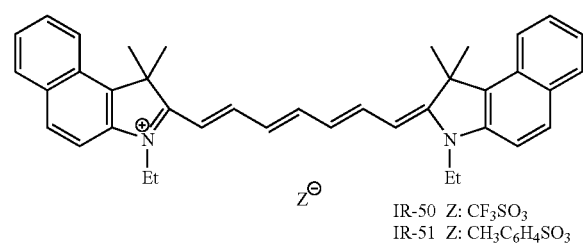

IR-50 Z: $CF_3SO_3$
IR-51 Z: $CH_3C_6H_4SO_3$
IR-52 Z: $ClO_4$

After the thus-obtained negative-type planographic printing plate precursors [P-1] to [P-5] and [Q-1] to [Q-3] were stored for 3 days under conditions of 60° C. 30% RH, they were exposed by using Trendsetter 3244 VFS (available from Creo Products Inc.) having a water-cooled 40 W infrared ray semiconductor laser mounted thereon under conditions of an output of 9 W, an outer drum rotary speed of 210 rpm, a printing plate surface energy of 100 mJ/cm² and a resolution of 2400 dpi.

Development

After being exposed as described above, the planographic printing plate precursors were developed by using an automatic processor STABLON 900N (trade name; available from Fuji Photo Film Co., Ltd.) to obtain planographic printing plates of Examples 1 to 5 ([P-1] to [P-5], respectively) and Comparative Examples 1 to 3 ([Q-1] to [Q-3], respectively). As a developer in both cases of a loading solution and a replenisher, a 1:1 water-diluted solution of DN-3C (trade name; available from Fuji Photo Film Co., Ltd.) was used. A temperature of a developing vat was set at 30° C. As for a finisher, a 1:1 water-diluted solution (pH: 10.8) of FN-6 (trade name; available from Fuji Photo Film Co., Ltd.) was used.

Evaluation

Evaluation of Stain

Printing operations were performed on the thus-obtained planographic printing plates [P-1] to [P-5] and [Q-1] to [Q-3] by using an oily ink available in the market by means of a printing machine Type SOR-M (trade name; available from Heidelberg Inc.). Then, whether or not a stain was generated in a non-image area was visually evaluated. Results are shown in Table 9.

Number of prints

Next, printing operations were performed on the thus-obtained planographic printing plates [P-1] to [P-5] and [Q-1] to [Q-3] by using a printing machine LITHRONE (trade name; available from Komori Corporation). It was appraised, based on a visual evaluation, how many sheets with sufficient ink density were able to be printed. Results are shown in Table 9.

Evaluation of Decomposition Ratio of Infrared Ray Absorbing Agent by Liquid Chromatography Components in the photosensitive layer of the planographic printing plates [P-1] to [P-5] and [Q-1] to [Q-3] which were subjected to coating treatments and, then, stored for 3 days at 60° C. 30% RH were extracted by a solvent and, then, a decomposition ratio of each of the infrared ray absorbing agents shown in Table 8 was determined by liquid chromatography and evaluated, based on the total amount before such storage defined as 100%. Results are shown in Table 9.

TABLE 9

| | Planographic Printing Plate | Stain in Non-image Area | Number of Prints | Decomposition Ratio of Infrared Ray Absorbing Agent |
|---|---|---|---|---|
| Example 1 | P-1 | Not generated | 65000 | 30% |
| Example 2 | P-2 | Not generated | 80000 | 40% |
| Example 3 | P-3 | Not generated | 50000 | 20% |
| Example 4 | P-4 | Not generated | 65000 | 5% |
| Example 5 | P-5 | Not generated | 65000 | 20% |
| Comparative Example 1 | Q-1 | Generated | — | 50% |
| Comparative Example 2 | Q-2 | Generated | — | 55% |
| Comparative Example 3 | Q-3 | Generated | — | 60% |

As is apparent from Table 9, in the planographic printing plates [P-1] to [P-5] of Examples 1 to 5 in which specific cyanine dyes were used as respective infrared ray absorbing agents, decomposition of the infrared ray absorbing agents which causes a problem in image forming didn't occur even under conditions of three-day storage at 60° C. 30% RH whereupon raw stock storability of the image recording material was excellent to allow a great number of printed articles having no stain in the non-image area thereof to be obtained. On the other hand, as to the planographic printing plates [Q-1] to [Q-3] of Comparative Examples 1 to 3 which used the infrared ray absorbing agent outside of the scope of the invention, it was found that the decomposition ratio of each of the infrared ray absorbing agents was high under the same conditions as those described above whereupon the stain was generated in the non-imnage area and, accordingly, properties as the printing plate were inferior.

Examples 6 to 11 and Comparative Examples 4 and 5

A coating solution for the photosensitive layer [R] as described below was prepared and, immediately after such preparation, was applied on such undercoated aluminum support by using the wire bar and, then, dried at 115° C. for 45 seconds by using the hot-air dryer to obtain negative-type planographic printing plate precursors [R-1] to [R-6], and [S-1] and [S-2]. A coated amount thereof after drying was 1.3 g/m². Infrared ray absorbing agents and radical generating agents used in each examples are shown in Table 10.

Coating Solution for Photosensitive Layer [R]

| | |
|---|---|
| Infrared ray absorbing agent (compounds shown in Table 10) | 0.10 g |
| Radical generating agent (compounds shown in Table 10) | 0.30 g |
| Multifunctional monomer having a structure as described below | 1.00 g |
| Addition-polymer of 4,4'-diphenylmethane diisocyanate, hexamethylene diisocyanate, tetraethyleneglycol and 2,2-bis(hydroxymethyl) propionic acid (addition-polymerization molar ratio of 30:20:30:20; mass average molecular weight of 60000) | 1.00 g |
| Naphthalene sulfonate of Victoria Pure Blue | 0.04 g |
| Fluorine-based surfactant (MEGAFAC F-176: trade name; available from Dainippon Ink and Chemicals, Inc.) | 0.01 g |
| Methyl ethyl ketone | 5.0 g |
| Methanol | 10.0 g |
| 1-methoxy-2-propanol | 8.0 g |
| Methyl lactate | 2.0 g |
| γ-butyrolactone | 2.0 g |

Multifunctional monomer

OCONH—CH₂CH₂CH₂CH₂CH₂CH₂—NHCO₂ structure with four methacrylate groups

TABLE 10

| Planographic Printing Plate Precursor | Infrared Ray Absorbing Agent | Radical Generating Agent |
|---|---|---|
| Example 6 | R-1 | IR-7 | OI-5 |
| Example 7 | R-2 | IR-8 | OI-5 |
| Example 8 | R-3 | IR-9 | ON-2 |
| Example 9 | R-4 | IR-10 | OS-4 |
| Example 10 | R-5 | IR-11 | OS-6 |

TABLE 10-continued

| Planographic Printing Plate Precursor | Infrared Ray Absorbing Agent | Radical Generating Agent |
|---|---|---|
| Example 11 | R-6 | IR-12 | OI-5 |
| Comparative Example 4 | S-1 | IR-53 | ON-2 |
| Comparative Example 5 | S-2 | IR-54 | OS-6 |

Further, a structure of the infrared ray absorbing agents used in Comparative Examples 4 and 5 is as follows:

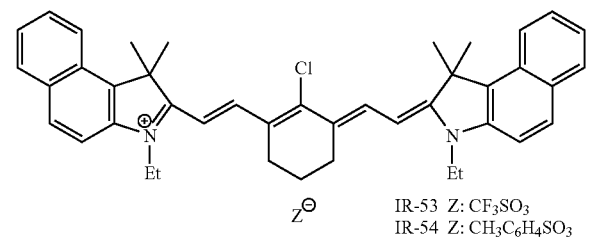

IR-53 Z: CF₃SO₃
IR-54 Z: CH₃C₆H₄SO₃

Exposure and Development

After the thus-obtained negative-type planographic printing plate precursors [R-1] to [R-6], and [S-1] and [S-2] were stored for 3 days under conditions of 60° C. 30% RH, they were exposed by using Luxel T-9000CTP (trade name; available from Fuji Photo Film Co., Ltd.) mounted with a multi-channel laser head under conditions of an output of 250 mW per laser beam, an outer drum rotating speed of 800 rpm and a resolution of 2400 dpi.

After being exposed as described above, the planographic printing plates precursors were developed in a same manner as in Examples 1 to 5 to obtain planographic printing plates of Examples 6 to 11 ([R-1] to [R-6], respectively) and Comparative Examples 4 and 5 ([S-1] and [S-2], respectively).

Evaluation

Evaluation of stain at the time of printing and evaluation of a number of prints were performed on the thus-obtained planographic printing plates: [R-1] to [R-6]; and [S-1] and [S-2] in a same manner as in Examples 1 to 5. Further, decomposition ratio of each of the infrared ray absorbing agents was determined by liquid chromatography. Results are shown in Table 11.

TABLE 11

| | Planographic Printing Plate | Stain in Non-image Area | Number of Prints | Decomposition Ratio of Infrared Ray Absorbing Agent |
|---|---|---|---|---|
| Example 6 | R-1 | Not generated | 65000 | 30% |
| Example 7 | R-2 | Not generated | 80000 | 40% |
| Example 8 | R-3 | Not generated | 50000 | 20% |
| Example 9 | R-4 | Not generated | 65000 | 5% |
| Example 10 | R-5 | Not generated | 65000 | 20% |
| Example 11 | R-6 | Not generated | 70000 | 5% |
| Comparative Example 4 | S-1 | Generated | — | 55% |
| Comparative Example 5 | S-2 | Generated | — | 60% |

As is apparent from Table 11, in the planographic printing plates [R-1] to [R-6] of Examples 6 to 11 in which specific cyanine dyes were used as respective infrared ray absorbing agents, decomposition of the infrared ray absorbing agents which causes a problem in image forming was not generated even under conditions of three-day storage at 60° C. 30% RH whereupon raw stock storability of the image recording material was excellent to allow a great number of printed articles having no stain in the non-image area thereof to be obtained. On the other hand, as to the planographic printing plates [S-1] and [S-2] of Comparative Examples 4 and 5 which used the infrared ray absorbing agents outside the scope of the invention, it was found that the decomposition ratio of each of the infrared ray absorbing agents was high under the same conditions as those described above whereupon the stain was generated in the non-image area and, accordingly, properties as the printing plate were inferior.

Examples 12 to 16 and
Comparative Examples 6 and 7

Preparation of Support

Aluminum supports were obtained in a same manner as in Examples 1 to 5 except that the silicate treatment for obtaining hydrophilicity was not conducted.

Next, each of the resulting aluminum supports was coated with an undercoat solution as described below by a wire bar and dried at 90° C. for 30 seconds by using a hot-air dryer. A coated amount thereof after drying was 10 mg/m².

Undercoat Solution

| | |
|---|---|
| β-alanine | 0.1 g |
| Phenyl phosphonic acid | 0.1 g |
| Methanol | 40 g |
| Pure water | 60 g |

Next, a coating solution for a photosensitive layer was prepared in a same manner as in Examples 1 to 5 except that the infrared ray absorbing agents and the radical generating agents used in the coating solution for the photosensitive layer [P] as used in Examples 1 to 5 were changed into those shown in Table 12 and applied on the undercoated aluminum plate by using the wire bar and, then, dried in a same manner as in Examples 1 to 5 to obtain negative-type planographic printing plate precursors [P-6] to [P-10] and [Q-5] to [Q-7].

TABLE 12

| | Planographic Printing Plate Precursor | Infrared Ray Absorbing Agent | Radical Generating Agent |
|---|---|---|---|
| Example 12 | P-6 | IR-19 | OI-5 |
| Example 13 | P-7 | IR-20 | OI-5 |
| Example 14 | P-8 | IR-21 | ON-2 |
| Example 15 | P-9 | IR-22 | OS-4 |
| Example 16 | P-10 | IR-23 | OS-6 |
| Comparative Example 6 | Q-5 | IR-55 | OI-5 |
| Comparative Example 7 | Q-6 | IR-56 | ON-2 |
| Comparative Example 8 | Q-7 | IR-57 | OS-6 |

Further, a structure of the infrared ray absorbing agents used in Comparative Examples 6 to 8 is as follows:

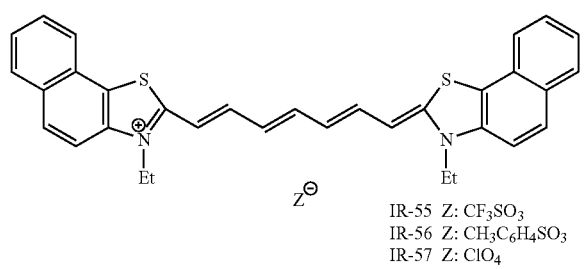

IR-55 Z: $CF_3SO_3$
IR-56 Z: $CH_3C_6H_4SO_3$
IR-57 Z: $ClO_4$

Exposure and Development

The thus-obtained planographic printing plate precursors were stored for 3 days under conditions of 60° C. 30% RH, then exposed and subjected to the development in a same manner as in Examples 1 to 5 except that the developer (pH:

11.7) was changed to that as described below to obtain planographic printing plates of Examples 12 to 16: [P-6] to [RP-10] and Comparative Examples 6 to 8: [Q-5] and [Q-7].

Developer

| | |
|---|---|
| Potassium hydroxide | 3.8 g |
| Polyethylene glycol mononaphthyl ether | 250 g |
| Tetrasodium ethylene diamine tetraacetate | 8 g |
| Water | 738 g |

Evaluation

Evaluation of stain at the time of printing and evaluation of a number of prints were performed on the thus-obtained planographic printing plates: [P-6] to [P-10]; and [Q-5] to [Q-7] in a same manner as in Examples 1to 5. Further, decomposition ratio of each of the infrared ray absorbing agents was determined by liquid chromatography. Results are shown in Table 13.

TABLE 13

| | Planographic Printing Plate | Stain in Non-image Area | Number of Prints | Decomposition Ratio of Infrared Ray Absorbing Agent |
|---|---|---|---|---|
| Example 12 | P-6 | Not generated | 65000 | 30% |
| Example 13 | P-7 | Not generated | 80000 | 40% |
| Example 14 | P-8 | Not generated | 50000 | 20% |
| Example 15 | P-9 | Not generated | 65000 | 5% |
| Example 16 | P-10 | Not generated | 65000 | 20% |
| Comparative Example 6 | Q-5 | Generated | — | 50% |
| Comparative Example 7 | Q-6 | Generated | — | 55% |
| Comparative Example 8 | Q-7 | Generated | — | 60% |

As is apparent from Table 13, in the planographic printing plates [P-6] to [P-10] of Examples 12 to 16 in which specific cyanine dyes were used as respective infrared ray absorbing agents, decomposition of the infrared ray absorbing agents which causes a problem in image forming was not generated even under conditions of three-day storage at 60° C. 30% RH whereupon raw stock storability of the image recording material was excellent to allow a great number of printed articles having no stain in the non-image area thereof to be obtained. On the other hand, as to the planographic printing plates [Q-5] and [Q-7] of Comparative Examples 6 to 8 which used the infrared ray absorbing agents outside the scope of the invention, it was found that the decomposition ratio of each of the infrared ray absorbing agents was high under the same conditions as those described above whereupon the stain was generated in the non-imnage area and, accordingly, properties as the printing plate were inferior.

Examples 17 to 19 and
Comparative Examples 9 to 11

Preparation of Support

An aluminum web having a thickness of 0.30 mm (JIS 1050 [AA10501]) was subjected to a degreasing treatment in a 10% aqueous solution of sodium aluminate at 50° C. for 30 seconds in order to remove rolling oil from a surface thereof and, then, subjected to a neutralizing treatment in a 30% aqueous solution of sulfuric acid at 50° C. for 30 seconds followed by a desmutting treatment.

Secondly, in order to improve a favorable contact characteristics between the support and the recording layer, a graining treatment was performed. On this occasion, an electrolytic graining treatment was conducted such that an electric current density of 20 A/dm$^2$ in an alternate waveform of duty ratio of 1:1 were applied on an anode side and a quantity of electricity of 240 C/dm$^2$ was given to the anode by an indirect power feeding cell while an aluminum web was allowed to pass through in an aqueous solution, containing 1% hydrochloric acid and 0.5% aluminum nitrate, which was held at 45° C. Thereafter, an etching treatment was conducted in a 10% aqueous solution of sodium aluminate at 50° C. for 30 seconds and, then, the neutralizing treatment was conducted in a 30% aqueous solution of sulfuric acid at 50° C. for 30 seconds followed by the desmutting treatment.

Further, an oxide film was formed. An anodic oxide film of 2.5 g/cm$^2$ was formed by conducting an electrolysis treatment in which a direct current of 14 A/dm$^2$ was applied by the indirect electric supply cell while the aluminum web. was allowed to pass through in an electrolyte that is a 20% aqueous solution of sulfuric acid at 35° C. Each of the resulting aluminum supports was coated with an undercoat solution as described below by a wire bar and dried at 90° C. for 30 seconds by using a hot-air dryer. A coated amount thereof after drying was 20 mg/m$^2$.

Undercoat Solution

| | |
|---|---|
| 2-methacryloyloxyethyl phosphoric acid | 0.4 g |
| Methanol | 20 g |
| Ion-exchanged water | 80 g |

Formation of Recording Layer

A coating solution[T] for a photosensitive layer as described below with distinct types of the infrared ray absorbing agents and the radical generating agents for each of the supports was applied on each of the supports, on which the above-described undercoat layer had been formed, by using the wire bar and, then, dried at 120° C. for 45 seconds by using the hot-air dryer to form a recording layer and, then, a coating solution for an overcoat layer as described below was applied on the thus-formed recording layer by using a slide hopper and, then, dried at 120° C. for 75 seconds by using the hot-air dryer to obtain planographic printing plate precursors [T-1] to [T-3] and [U-1] to [U-3] of Examples 17 to 19 and Comparative Examples 9 to 11, respectively. A coated amount of the recording layer was 2.0 g/m$^2$ while that of the overcoat layer was 2.3 g/m$^2$. Infrared ray absorbing agents and radical generating agents used on this occasion are shown in Table 16.

Coating Solution for Photosensitive Layer [T]

| | |
|---|---|
| Infrared ray absorbing agent (compounds shown in Table 14) | 0.10 g |
| Radical generating agent (compounds shown in Table 14) | 0.15 g |
| Dipentaerythritol tetraacrylate | 0.20 g |

| | |
|---|---|
| Addition product of isophorone diisocyanate and 2-hydroxyethyl acrylate | 0.60 g |
| Polyurethane prepared from diphenylmethane diisocyanate, hexamethylene diisocyanate, bis(hydroxymethyl)propionic acid and tetraethylene glycol (composition molar ratio: 30:20:20:30; mass average molecular weight: 120000) | 1.20 g |
| Crystal Violet dye | 0.06 g |
| Polymerization inhibitor (CUPFERRON A1: trade name; available from Wako Pure Chemical Industries, Ltd.) | 0.005 g |
| Fluorine-based surfactant (MEGAFAC KF 309: trade name; available from Dainippon Ink and Chemicals, Inc.) | 0.03 g |
| Methyl ethyl ketone | 10 g |
| γ-Butyrolactone | 5 g |
| Methanol | 7 g |
| 1-methoxy-2-propanol | 5 g |

Coating Solution for Overcoat Layer

| | |
|---|---|
| Polyvinyl alcohol (degree of saponification: 98.5 mol %; degree of polymerization: 500) | 2.5 g |
| Polyvinyl pyrrolidone (K 30: trade name; available from Tokyo Kasei Kogyo Co., Ltd.; molecular weight: 40000) | 0.5 g |
| Nonionic surfactant (EMAREX NP-10: trade name; available from Nihon-Emulsion Co., Ltd.) | 0.05 g |
| Ion-exchanged water | 96.95 g |

TABLE 14

| | Planographic Printing Plate Precursor | Infrared Ray Absorbing Agent | Radical Generating Agent |
|---|---|---|---|
| Example 17 | T-1 | IR-27 | OI-5 |
| Example 18 | T-2 | IR-34 | ON-2 |
| Example 19 | T-3 | IR-40 | OS-6 |
| Comparative Example 9 | U-1 | IR-58 | OI-5 |
| Comparative Example 10 | U-2 | IR-59 | ON-2 |
| Comparative Example 11 | U-3 | IR-60 | OS-6 |

Further, a structure of the infrared ray absorbing agents used in Comparative Examples 9 to 11 is as follows:

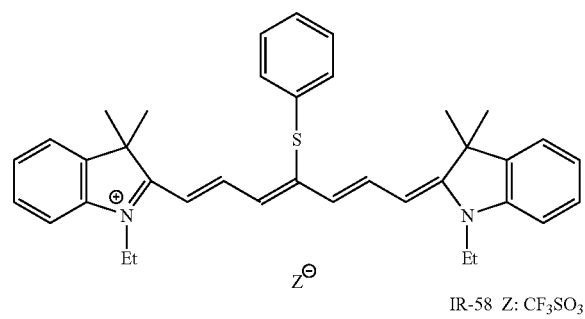

IR-58 Z: $CF_3SO_3$

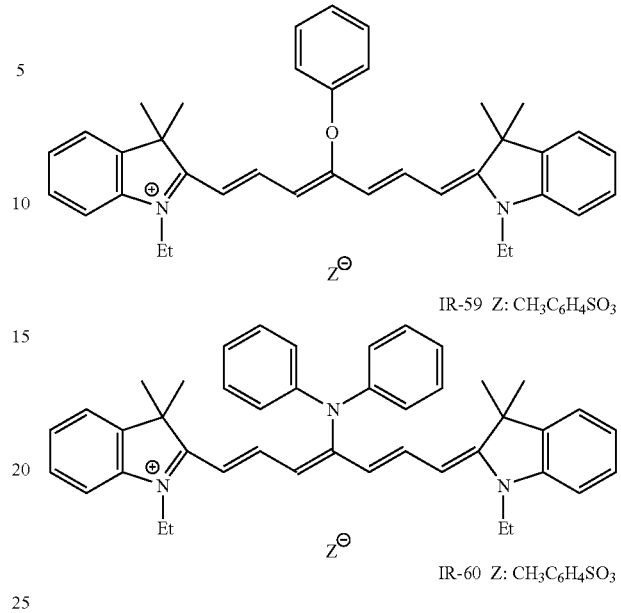

IR-59 Z: $CH_3C_6H_4SO_3$

IR-60 Z: $CH_3C_6H_4SO_3$

Exposure and Development

After the thus-obtained negative-type planographic printing plate precursors [T-1] to [T-3] and [U-1] to [U-3] were stored for 3 days under conditions of 60° C. 30% RH, they were subjected to an image forming treatment by using a CTP output system (available from Fuji Photo Film Co., Ltd.) comprising a printing plate material supply apparatus (SA-L8000: trade name), an exposure apparatus (Luxel T-9000CTP: trade name), a conveyor (T-9000 CONVEYOR: trade name), an automatic processor having a preheating and pre-water-rinsing mechanism (FLP-125NFS: trade name) and a stocker (ST-1160: trade name). Such preheating was set such that a temperature of the printing plate surface was allowed to be 120° C. while such pre-water-rinsing was performed by tap water. Further, a developer having a composition as described below was loaded in a developing section of the automatic processor and held at 30° C. Tap water was loaded in a water-washing section thereof while a finishing gum solution which is a 1:1 water-diluted solution of FP-2W (trade name; available from Fuji Photo Film Co., Ltd.) was loaded in a finisher section of the automatic processor.

Developer

| | |
|---|---|
| Potassium silicate | 0.2 mass % |
| Potassium carbonate | 0.2 mass % |
| Ethylene glycol mononaphthyl ether | 3.8 mass % |
| Sodium butylnaphthalene sulfonate | 1.0 mass % |
| EDTA tetrasodium salt | 0.1 mass % |
| Water | 94.7 mass % |

Evaluation of stain at the time of printing and evaluation of a number of prints were performed on the thus-obtained planographic printing plates: [T-1] to [T-3]; and [U-1] to [U-3] of Examples 17 to 19 and Comparative Examples 9 to 11 in a same manner as in Examples 1 to 5. Further, decomposition ratio of each of the infrared ray absorbing agents was determined by liquid chromatography. Results are shown in Table 15.

TABLE 15

| | Planographic printing plate | Stain in Non-Image Area | Number of prints | Decomposition Ratio of Infrared Ray Absorbing Agent |
|---|---|---|---|---|
| Example 17 | T-1 | Not generated | 65000 | 20% |
| Example 18 | T-2 | Not generated | 50000 | 20% |
| Example 19 | T-3 | Not generated | 65000 | 20% |
| Comparative Example 9 | U-1 | Generated | — | 50% |
| Comparative Example 10 | U-2 | Generated | — | 55% |
| Comparative Example 11 | U-3 | Generated | — | 60% |

As is apparent from Table 15, in the planographic printing plates [T-1] to [T-3] of Examples 17 to 19 in which specific cyanine dyes were used as respective infrared ray absorbing agents, decomposition of the infrared ray absorbing agents which causes a problem in image forming was not generated even under conditions of three-day storage at 60° C. 30% RH whereupon raw stock storability of the image recording material was excellent to allow a great number of printed articles having no stain in the non-image area thereof to be obtained. On the other hand, as to the planographic printing plates [U-1] to [U-3] of Comparative Examples 9 to 11 which used the infrared ray absorbing agents outside the scope of the invention, it was found that the decomposition ratio of each of the infrared ray absorbing agents was high under the same conditions as those described above whereupon the stain was generated in the non-image area and, accordingly, properties as the printing plate were inferior.

According to the invention, it was found that, by recording by using a solid laser or a semiconductor laser which emits an infrared ray, it became possible to perform recording directly from digital data provided by, for example, a computer and, also, a negative-type image recording material can be provided which is excellent in storage stability, particularly, raw stock storability when the negative-type image recording material was used as a recording layer of a planographic printing plates.

What is claimed is:

1. A negative-type planographic printing plate having, disposed on a support, at least a recording layer comprising a radical-polymerizable negative-type image recording material on which an image can be recorded by irradiation with an infrared ray, the radical-polymerizable negative-type image recording material including an infrared ray absorbing agent comprising a cyanine dye in which at least one of substituents on nitrogen atoms at both terminal ends thereof is selected from the group consisting of the following substituents:

—C(=X)R$^1$;
—C(=X)R$^2$R$^3$;
—CH=CR$^4$R$^5$;
—C≡CR$^6$;
—CR$^9$R$^{10}$R$^{11}$; and
—Ar, wherein X represents O or S; R$^1$ to R$^6$ each independently represent H or a hydrocarbon group having 20 or fewer carbon atoms which may have a substituent; R$^7$ to R$^{11}$ each independently represent a hydrocarbon group having 20 or fewer carbon atoms which may have a substituent; Ar represents an aromatic group which may have a substituent; and wherein the radical-polymerizable negative-type image recording material further comprises a radical generating agent and a radical polymerizable compound.

2. The negative-type planographic printing plate of claim 1, wherein the infrared ray absorbing agent comprises a cyanine dye represented by the following general formula (1):

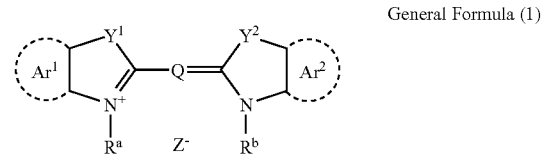

General Formula (1)

wherein R$^a$ and R$^b$ may be the same as or different from each other and each independently represent a hydrogen atom or a monovalent substituent, and at least one of R$^a$ and R$^b$ represents a substituent selected from the group consisting of:

—C(=X)R$^1$;
—C(=X)NR$^2$R$^3$;
—CH=CR$^4$R$^5$;
—C≡CR$^6$;
—CHR$^7$R$^8$;
—CR$^9$R$^{10}$R$^{11}$; and
—Ar, wherein R$^1$ to R$^6$ each independently represent H or a hydrocarbon group having 20 or fewer carbon atoms which may have a substituent; R$^7$ to R$^{11}$ each independently represent a hydrocarbon group having 20 or fewer carbon atoms which may have a substituent; X represents O or S; Ar$^1$ and Ar$^2$ each independently represent an aromatic hydrocarbon group or a heterocyclic group which may have a substituent; Y$^1$ and Y$^2$ may be the same as or different from each other and each independently represent one selected from the group consisting of a sulfur atom, an oxygen atom, a selenium atom, a dialkylmethylene group having 12 or less carbon atoms, —CH=CH— and —NR$^{Y1}$—; Q represents a pentamethine group or a heptamethine group; and Z$^-$ represents a counter ion which is present when neutralization of an electric charge is required;

R$^{Y1}$ represents H or a hydrocarbon group having 20 or fewer carbon atoms which may have a substituent.

3. The negative-type planographic printing plate of claim 1, wherein the infrared ray absorbing agent is contained in an amount ranging from 0.01% by mass to 50% by mass based on a total solid content of the radical-polymerizable negative-type image recording material.

4. The negative-type planographic printing plate of claim 1, wherein the infrared ray absorbing agent comprises at least one of an infrared ray absorbing dye and an infrared ray absorbing pigment, both of which have an absorption maximum in a wavelength range from 760 nm to 1200 nm.

5. The negative-type planographic printing plate of claim 1, wherein the radical generating agent comprises at least one member selected from the group consisting of an onium salt, a triazine compound, a peroxide, an azo polymerization initiator, an azide compound, a quinone diazide compound, a metallocene compound and an organic borate compound.

6. The negative-type planographic printing plate of claim 1, wherein the radical generating agent comprises an onium salt selected from the group consisting of a diazonium salt, an iodonium salt, a sulfonium salt, an ammonium salt and a pyridinium salt.

7. The negative-type planographic printing plate of claim 1, wherein the radical generating agent comprises an onium salt selected from the group consisting of onium salts represented by the following general formulae (I) to (III):

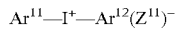   General Formula(I)

   General Formula(II)

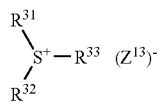   General Formula (III)

wherein, in general formula (I), $Ar^{11}$ and $Ar^{12}$ each independently represent an aryl group having 20 or fewer carbon atoms which may have a substituent; and $(Z^{11})^-$ represents a counter ion selected from the group consisting of a halogen ion, a perchloric ion, a tetrafluoroborate ion, a hexafluorophosphate ion, a carboxylate ion and a sulfonic acid ion, wherein, in general formula (II), $Ar^{21}$ represents an aryl group having 20 or fewer carbon atoms which may have a substituent; and $(Z^{12})^-$ represents a counter ion equivalent to $(Z^{11})^-$, and wherein, in general formula (III), $R^{31}$ to $R^{33}$ may be the same as or different from one another and each independently represent a hydrocarbon group having 20 or fewer carbon atoms which may have a substituent; and $(Z^{13})^-$ represents a counter ion equivalent to $(Z^{11})^-$.

8. The negative-type planographic printing plate of claim 1, wherein the radical generating agent is contained in an amount ranging from 0.1% by mass to 50% by mass based on a total solid content of the radical-polymerizable negative-type image recording material.

9. The negative-type planographic printing plate of claim 1, wherein the radical polymerizable compound has at least one ethylenically unsaturated double bond.

10. The negative-type planographic printing plate of claim 1, wherein the radical polymerizable compound comprises at least one selected from the group consisting of an unsaturated carboxylic acids, unsaturated carboxylic acid esters and unsaturated carboxylic acid amides.

11. The negative-type planographic printing plate of claim 1, wherein the radical-polymerizable negative-type image recording material further comprises a binder polymer.

12. The negative-type planographic printing plate of claim 11, wherein the binder polymer is a linear organic polymer that is soluble or swellable in at least one of water and weak-alkaline water.

13. The negative-type planographic printing plate of claim 11, wherein the binder polymer is contained in an amount ranging from 20% by mass to 95% by mass based on a total solid content of the radical-polymerizable negative-type image recording material.

14. The negative-type planographic printing plate of claim 1, wherein the radical-polymerizable negative-type image recording material further comprises a coloring agent.

15. The negative-type planographic printing plate of claim 1, wherein the radical-polymerizable negative-type image recording material further comprises a thermal polymerization inhibitor.

16. The negative-type planographic printing plate of claim 1, wherein the radical-polymerizable negative-type image recording material further comprises at least one of a nonionic surfactant and an amphoteric surfactant.

17. The negative-type planographic printing plate of claim 1, wherein the radical-polymerizable negative-type image recording material further comprises a plasticizer.

* * * * *